United States Patent
Wang et al.

(10) Patent No.: US 12,074,061 B2
(45) Date of Patent: Aug. 27, 2024

(54) FIELD EFFECT TRANSISTOR WITH MULTI-METAL GATE VIA AND METHOD

(71) Applicant: Taiwan Semiconductor Manufacturing Co., Ltd., Hsinchu (TW)

(72) Inventors: Sheng-Tsung Wang, Hsinchu (TW); Lin-Yu Huang, Hsinchu (TW); Cheng-Chi Chuang, Hsinchu (TW); Sung-Li Wang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 395 days.

(21) Appl. No.: 17/407,083

(22) Filed: Aug. 19, 2021

(65) Prior Publication Data
US 2023/0053595 A1 Feb. 23, 2023

(51) Int. Cl.
| | |
|---|---|
| H01L 21/768 | (2006.01) |
| H01L 23/522 | (2006.01) |
| H01L 29/40 | (2006.01) |
| H01L 29/417 | (2006.01) |
| H01L 29/423 | (2006.01) |
| H01L 29/66 | (2006.01) |
| H01L 29/786 | (2006.01) |

(52) U.S. Cl.
CPC .... *H01L 21/76846* (2013.01); *H01L 23/5226* (2013.01); *H01L 29/401* (2013.01); *H01L 29/41733* (2013.01); *H01L 29/42392* (2013.01); *H01L 29/66742* (2013.01); *H01L 29/78696* (2013.01)

(58) Field of Classification Search
CPC ......... H01L 21/76843; H01L 21/76846; H01L 21/823431; H01L 21/823475; H01L 27/088; H01L 23/485; H01L 23/5226; H01L 29/0673; H01L 29/401; H01L 29/41733; H01L 29/41766; H01L 29/42392; H01L 29/42376; H01L 29/66742; H01L 29/66459; H01L 29/66545; H01L 29/7848; H01L 29/78696; H01L 29/775
USPC ........................................................ 257/401
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |

(Continued)

*Primary Examiner* — Fazli Erdem
(74) *Attorney, Agent, or Firm* — Seed IP Law Group LLP

(57) ABSTRACT

A device includes a substrate, a gate structure wrapping around a vertical stack of nanostructure semiconductor channels, and a source/drain abutting the vertical stack and in contact with the nanostructure semiconductor channels. The device includes a gate via in contact with the first gate structure. The gate via includes a metal liner layer having a first flowability, and a metal fill layer having a second flowability higher than the first flowability.

20 Claims, 45 Drawing Sheets

(56) References Cited

U.S. PATENT DOCUMENTS

| | | | |
|---|---|---|---|
| 2019/0164827 A1* | 5/2019 | Yang | H01L 21/76877 |
| 2021/0057273 A1* | 2/2021 | Chen | H01L 21/76844 |
| 2021/0098376 A1* | 4/2021 | Lin | H01L 21/32134 |
| 2022/0165659 A1* | 5/2022 | Huang | H01L 23/53252 |

\* cited by examiner

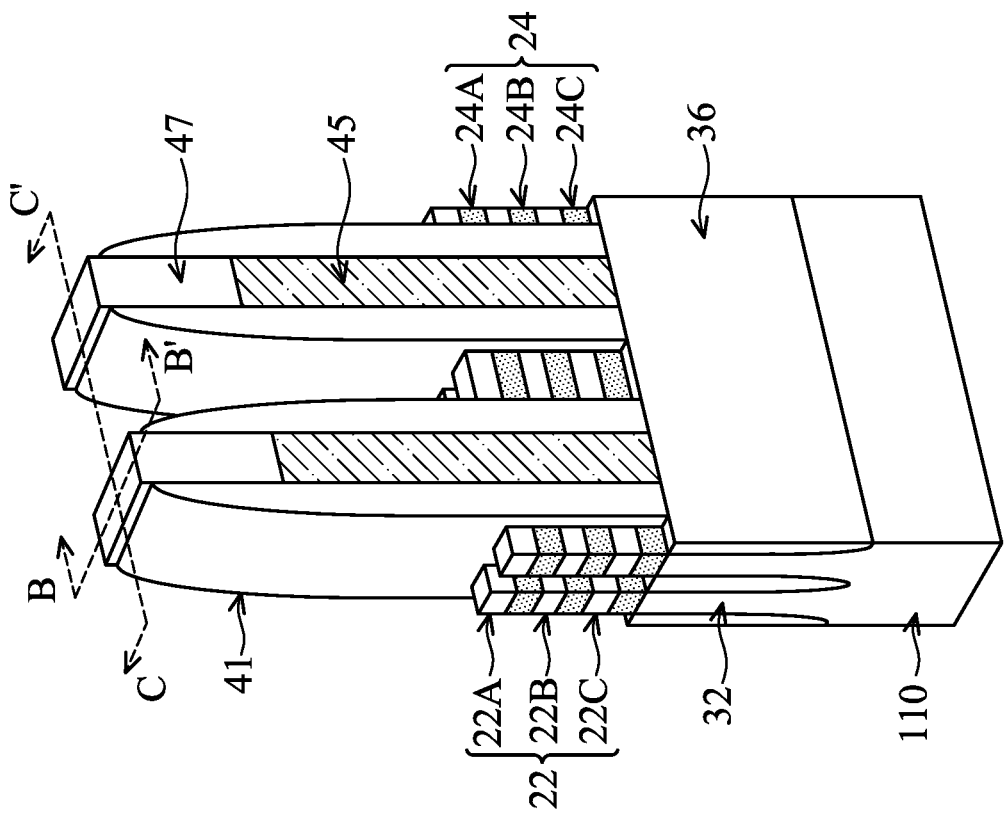
FIG. 4A
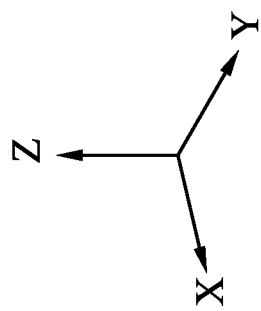

FIELD EFFECT TRANSISTOR WITH MULTI-METAL GATE VIA AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
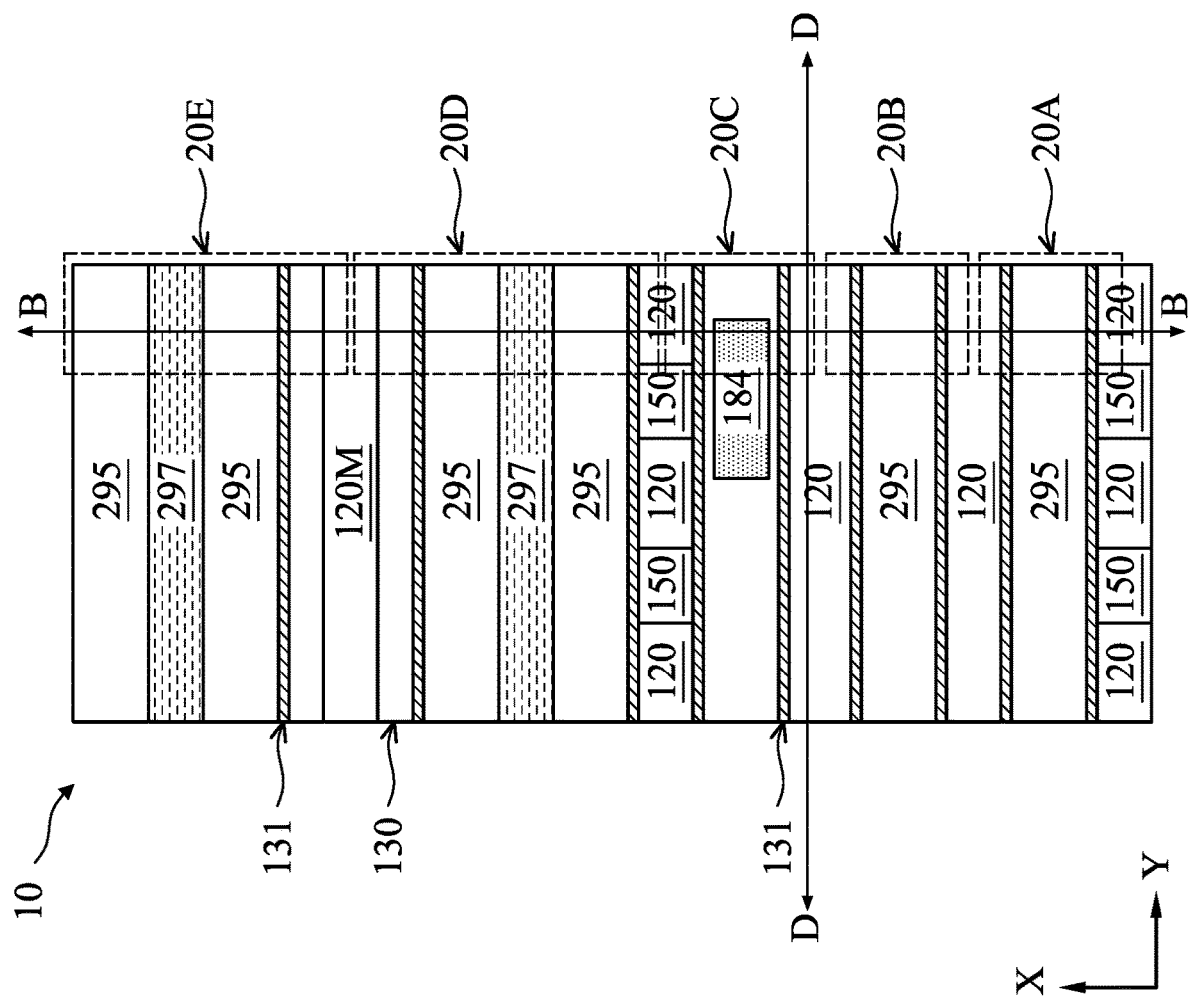
FIGS. 1A-1D are diagrammatic top and cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

The present disclosure is generally related to semiconductor devices, and more particularly to field-effect transistors (FETs), such as planar FETs, three-dimensional fin-line FETs (FinFETs), or gate-all-around (GAA) devices. In advanced technology nodes, dimension scaling can lead to difficulties forming contacts and vias to the gate, source and drain electrodes of the FETs. The issue of metal gap fill becomes more serious, such that voids become common in the gate via in particular. The voids degrade device performance, and may even cause an open circuit. As regards source/drain vias, using different metal materials for the metallization contacting the source/drain and the source/drain via results in degraded contact resistance, leading to unsatisfactory device performance.

In embodiments of the disclosure, an efficient metal gap fill method is provided that improves metal gap fill in the gate via (VG). Also, the same metal material is used in the source/drain via (VD) and the source/drain metallization (MD), which dramatically reduces contact resistance between the two features. Two different metal liners and bulk fill metal are applied to improve VG gap fill quality. VD and MD are made of the same metal to minimize contact resistance. As such, the method and structure disclosed herein not only enable further scaling, but also provide lower contact resistance.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
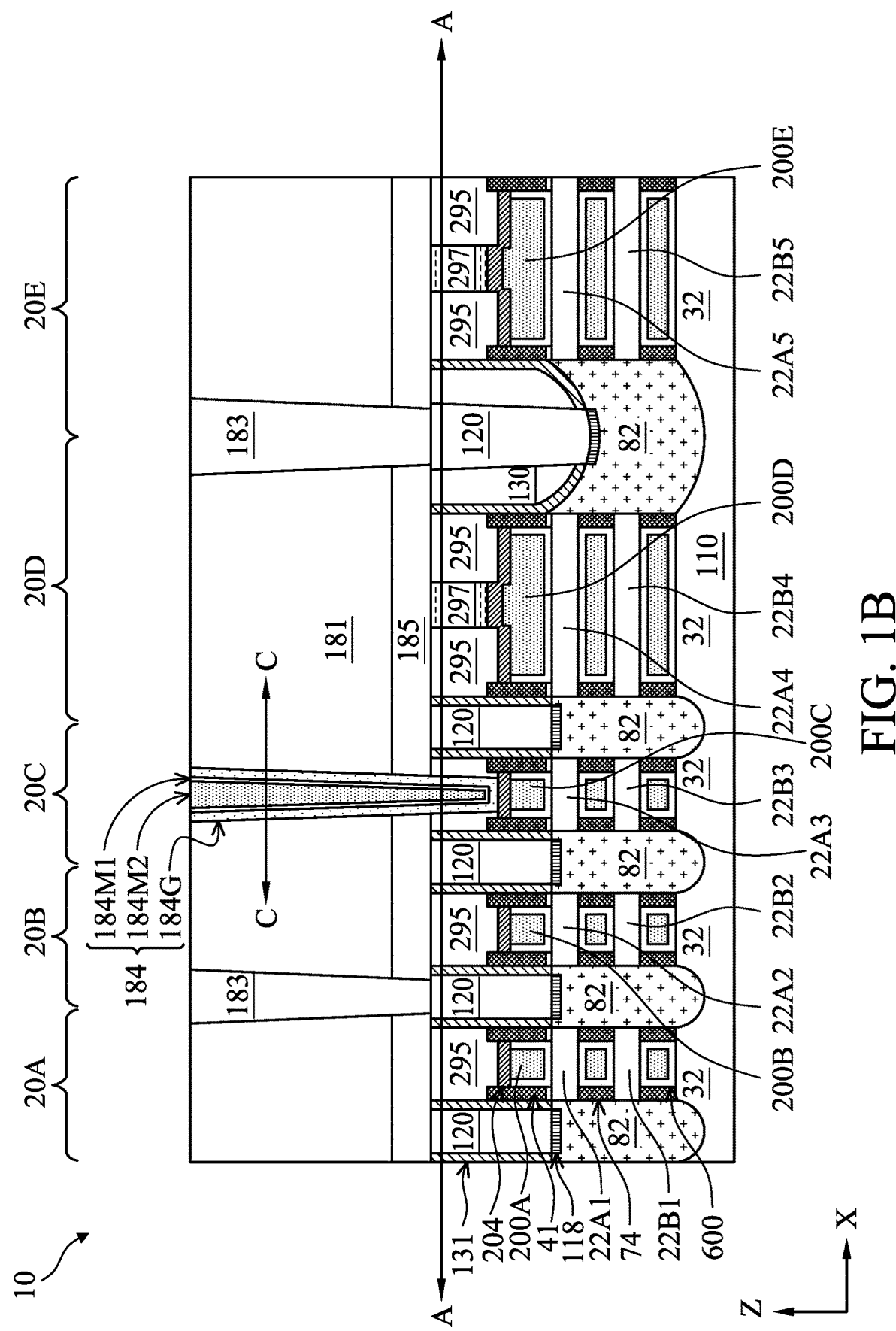
Figure 1C:
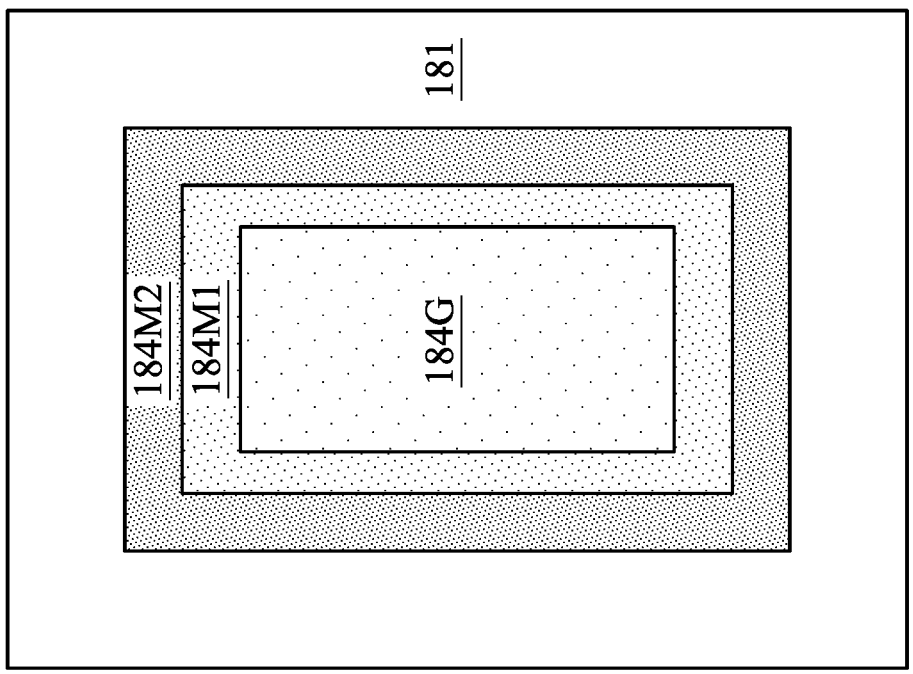
Figure 1D:
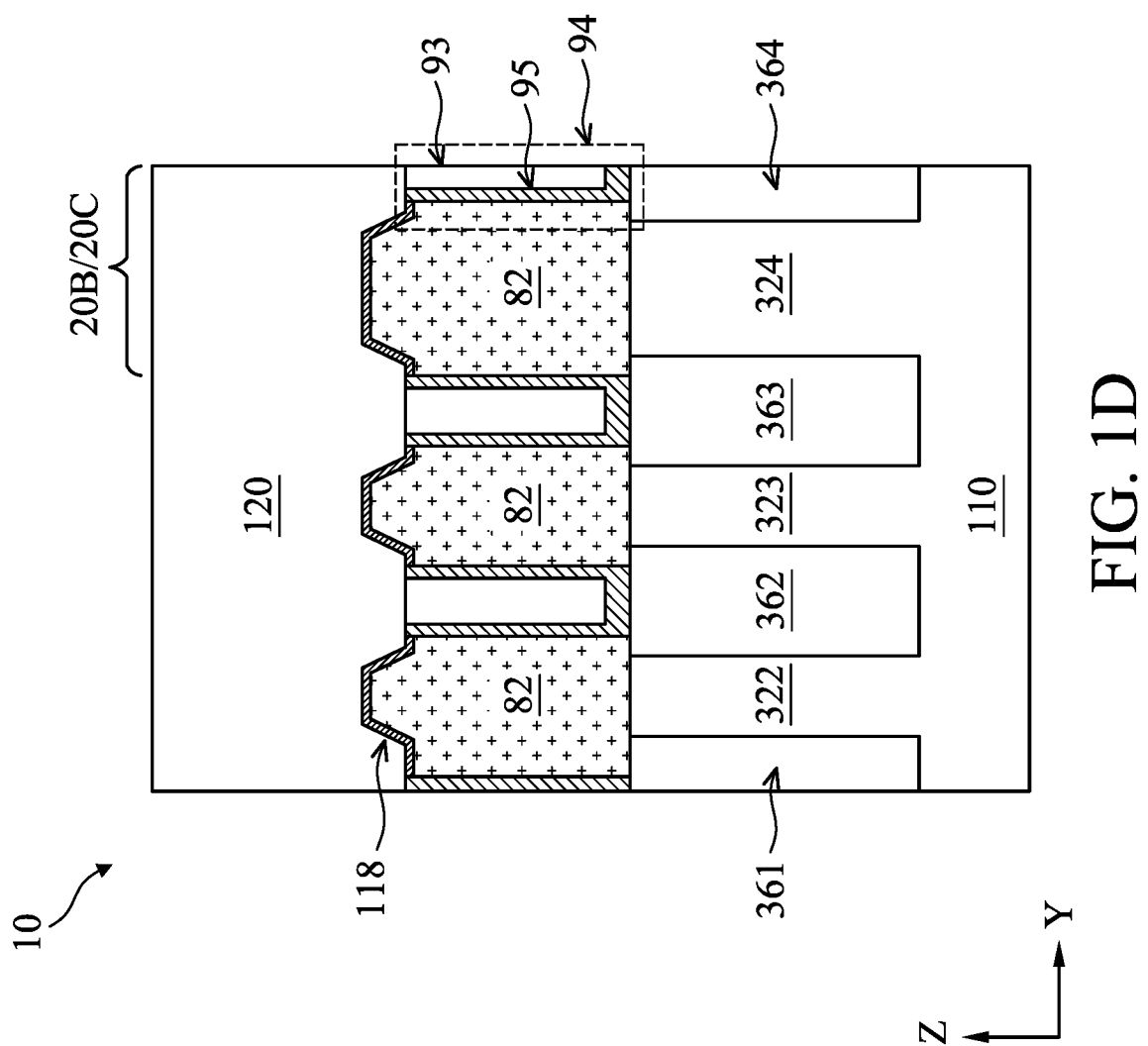

FIGS. 1A-1D illustrate diagrammatic top and cross-sectional side views of a portion of an IC device 10 fabricated according to embodiments of the present disclosure, where the IC device 10 includes gate-all-around (GAA) devices 20A-20E. FIG. 1A is a diagrammatic top view of the portion of the IC device 10 including the GAA devices 20A-20E. FIG. 1B is a cross-sectional side view of a portion of the IC device 10 along the line B-B shown in FIG. 1A. FIG. 1C is a cross-sectional top view of a single gate via 184. FIG. 1D is a cross-sectional side view of a portion of the IC device 10 along the line D-D shown in FIG. 1A. Certain features may be removed from view intentionally in the views of FIGS. 1A-1D for simplicity of illustration.

The GAA devices 20A-20E may include at least an N-type FET (NFET) or a P-type FET (PFET) in some embodiments. Integrated circuit devices such as the IC device 10 frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

Referring to FIG. 1A and FIG. 1B, the GAA devices 20A-20E are formed over and/or in a substrate 110, and generally include gate structures 200A-200E straddling and/or wrapping around semiconductor channels, alternately referred to as "nanostructures," located over semiconductor fins 322-324 protruding from, and separated by, isolation structures 361-364 (see FIG. 1D). The channels are labeled "22AX" to "22BX," where "X" is an integer from 1 to 5, corresponding to the five transistors 20A-20E, respectively. Each gate structure 200A-200E controls current flow through the channels 22A1-22B5.

The channels 22A1-22B5 each include a semiconductive material, for example silicon or a silicon compound, such as silicon germanium, or the like. The channels 22A1-22B5 are nanostructures (e.g., having sizes that are in a range of a few nanometers) and may also each have an elongated shape and extend in the X-direction. In some embodiments, the channels 22A1-22B5 each have a nano-wire (NW) shape, a nano-sheet (NS) shape, a nano-tube (NT) shape, or other suitable nanoscale shape. The cross-sectional profile of the channels 22A1-22B5 may be rectangular, round, square, circular, elliptical, hexagonal, or combinations thereof.

In some embodiments, the lengths (e.g., measured in the X-direction) of the channels 22A1-22B5 may be different from each other, for example due to tapering during a fin etching process. In some embodiments, length of the channel 22A1 may be less than a length of the channel 22B1. The channels 22A1-22B5 each may not have uniform thickness, for example due to a channel trimming process used to expand spacing (e.g., measured in the Z-direction) between the channels 22A1-22B5 to increase gate structure fabrication process window. For example, a middle portion of each of the channels 22A1-22B5 may be thinner than the two ends of each of the channels 22A1-22B5. Such shape may be collectively referred to as a "dog-bone" shape.

In some embodiments, the spacing between the channels 22A1-22B5 (e.g., between the channel 22B2 and the channel 22A2) is in a range between about 8 nanometers (nm) and about 12 nm. In some embodiments, a thickness (e.g., measured in the Z-direction) of each of the channels 22A1-22B5 is in a range between about 5 nm and about 8 nm. In some embodiments, a width (e.g., measured in the Y-direction, not shown in FIG. 1B, orthogonal to the X-Z plane) of each of the channels 22A1-22B5 is at least about 8 nm.

The gate structures 200A-200E are disposed over and between the channels 22A1-22B5, respectively. In some embodiments, the gate structures 200A-200E are disposed over and between the channels 22A1-22B5, which are silicon channels for N-type devices or silicon germanium channels for P-type devices. In some embodiments, the gate structures 200A-200E include an interfacial layer (IL) 210, one or more gate dielectric layers 600, one or more work function tuning layers 900, and a metal fill layer 290, which are shown and described in greater detail with reference to FIG. 12.

The interfacial layer 210, which may be an oxide of the material of the channels 22A1-22B5, is formed on exposed areas of the channels 22A1-22B5 and the top surface of fins 32. The interfacial layer 210 promotes adhesion of the gate dielectric layers 600 to the channels 22A1-22B5. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

Figure 12:
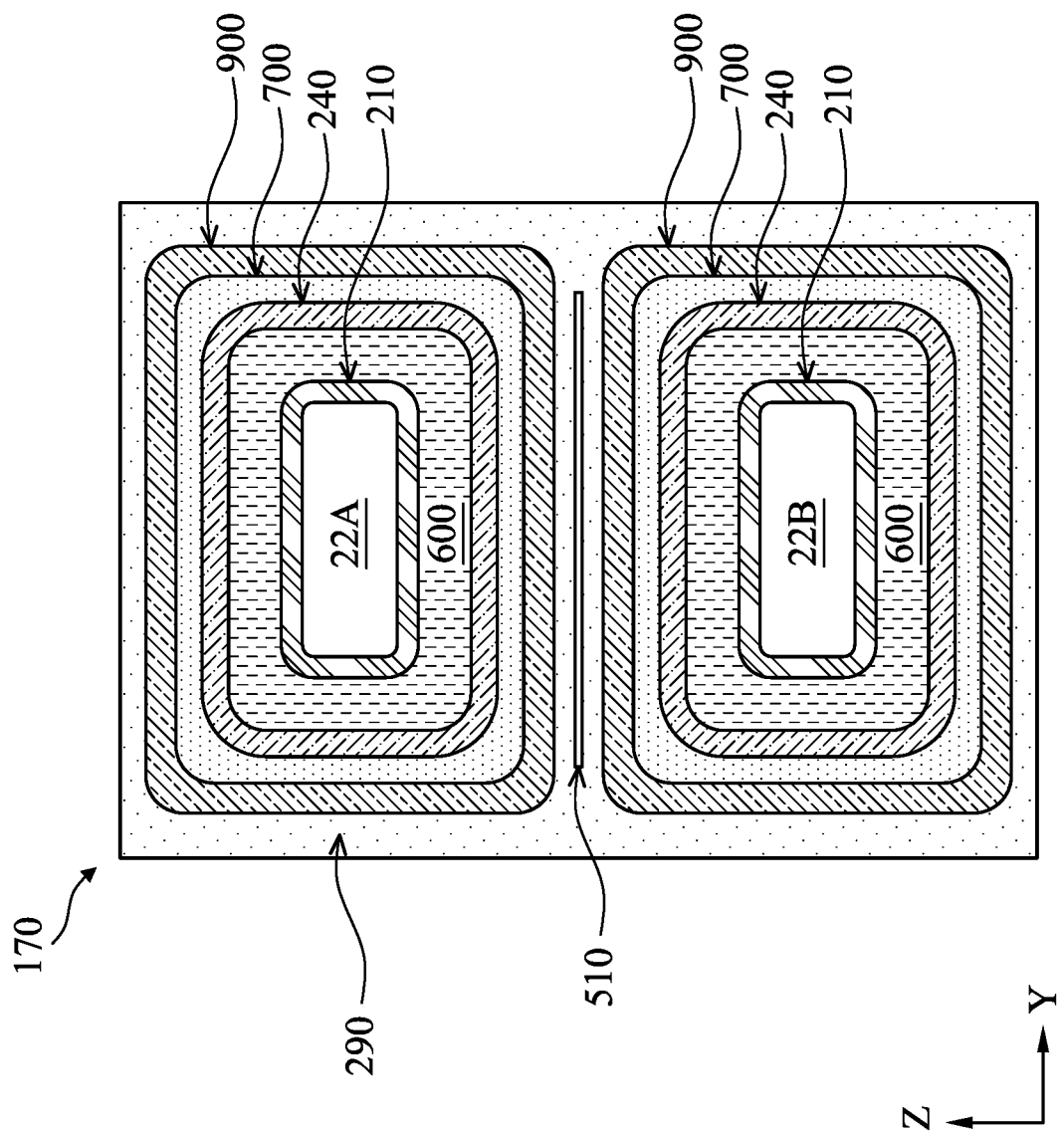

In some embodiments, the gate structure 200B further includes one or more work function metal layers, represented collectively as work function metal layer 900 (see FIG. 12). When configured as an NFET, the work function metal layer 900 of the GAA device 20B may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TIN, WN, MON, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200B also includes metal fill layer 290. The metal fill layer 290 may include a conductive material such as tungsten, cobalt, ruthenium, iridium, molybdenum, copper, aluminum, or combinations thereof. Between the channels 22A1-22B5, the metal fill layer 290 is circumferentially surrounded (in the cross-sectional view) by the one or more work function metal layers 900, which are then circumferentially surrounded by the gate dielectric layers 600. The gate structure 200B may also include a glue layer that is formed between the one or more work function layers 900 and the metal fill layer 290 to increase adhesion. The glue layer is not specifically illustrated in FIGS. 1A-1D for simplicity.

The GAA devices 20A-20E also include gate spacers 41 and inner spacers 74 that are disposed on sidewalls of the gate dielectric layer 600 and the IL 210. The inner spacers 74 are also disposed between the channels 22A1-22B5. The gate spacers 41 and the inner spacers 74 may include a dielectric material, for example a low-k material such as SiOCN, SiON, SiN, or SiOC. In some embodiments, one or more additional spacer layers are present abutting the gate spacers 41.

The GAA devices 20A-20E may further include source/drain contacts 120M, 120S (shown in FIG. 1A; collectively referred to as "source drain contacts 120") that are formed over the source/drain features 82. The source/drain contacts 120 may include a conductive material such as tungsten, ruthenium, cobalt, copper, titanium, titanium nitride, tantalum, tantalum nitride, iridium, molybdenum, nickel, aluminum, or combinations thereof. The source/drain contacts 120 may be surrounded by barrier (or "glue") layers (not shown), such as SiN, TiN, TaN or the like, which help prevent or reduce diffusion of materials from and into the source/drain contacts 120. In some embodiments, thickness of the barrier layer is in a range of about 3 Angstroms to about 30 Angstroms. In some embodiments, the barrier layer is not present. A silicide layer 118 may also be formed between the source/drain features 82 and the source/drain contacts 120, so as to reduce the source/drain contact resistance. In some embodiments, the silicide layer 118 is or includes one or more of nickel, cobalt, titanium, tantalum, platinum, tungsten, other noble metals, other refractory metals, rare earth metals or their alloys. For example, the silicide layer 118 may be TiSi, NiSi, MoSi, RuSi, WSi or the like. In some embodiments, thickness of the silicide layer 118 (in the Z direction) is in a range of about 0.5 nm to about 8 nm, such as in a range of about 2 nm to about 5 nm. In some embodiments, height of the source/drain contacts 120 may be in a range of about 1 nm to about 50 nm.

As shown in FIGS. 1A and 1D, one or more of the source/drain contacts, labeled 120M, may each overlie multiple GAA devices along the Y-direction. In some embodiments, others of the source/drain contacts, labeled 120S, may each overlie a single GAA device along the Y-direction. FIG. 1D illustrates a cross-sectional side view in the Y-Z plane along the line D-D of FIG. 1A, in which source/drain contacts 120S overlie source/drain regions 82 and are separated by source/drain contact isolation structures 150. In some embodiments, each of the source/drain regions 82 is formed over a respective fin 322, 323, 324, and is separated from others of the source/drain regions 82 by hybrid fins 94 (or "inactive fins 94") formed over isolation regions 361-364. In some embodiments, the isolation regions 361-364 are shallow trench isolation ("STI") regions. In some embodiments, each of the hybrid fins 94 includes a liner layer 93 (or "dielectric layer 93") and a fill layer 95 (or "oxide layer 95"). Each of the source/drain contact isolation structures 150 may extend from an upper surface of a respective hybrid fin 94 to at least upper surfaces of the source/drain contacts 120S abutting either side of the source/drain contact isolation structure 150, such that the source/drain contact isolation structure 150 completely electrically isolates the source drain contact 120S on a first side of the source/drain contact isolation structure 150 from the source drain contact 120S on a second opposite side of the source/drain contact isolation structure 150. In the Y direction, each of the source/drain contact isolation structures 150 may extend from a first sidewall of the source/drain contact 120S on the first side of the source/drain contact isolation structure 150 two a second side wall of the source/drain contact 120S on the second side of the source/drain contact isolation structure 150. In some embodiments, each of the source/drain contact isolation structures 150 has a first sidewall (or first sidewall portion) in direct physical contact with the source/drain contact 120S on its first side and a second side wall (or second side wall portion) in direct physical contact with the source/drain contact 120S on it second side. In some embodiments, each of the source/drain contact isolation structures 150 is or includes SiN, SiCN, SiC, SiOC, SiOCN, HfO2, ZrO2, ZrAlOx, HfAlOx, HfSiOx, Al2O$_3$, or another suitable dielectric material. In some embodiments, width of the source/drain contact isolation structures 150 (along the Y direction) is in a range of about 8 nm to about 30 nm.

Referring again to FIGS. 1A and 1B, certain of the GAA devices, such as the GAA devices 20D, 20E, further include an interlayer dielectric (ILD) 130. The ILD 130 provides electrical isolation between the various components of the GAA devices 20D, 20E discussed above, for example between the gate structures 200D, 200E and the source/drain contact 120/120M therebetween. The etch stop layer 131 may be formed prior to forming the ILD 130, and may be positioned laterally between the ILD 130 and the gate spacers 41 and vertically between the ILD 130 and the source/drain features 82. In some embodiments, the etch stop layer 131 is or includes SiN, SiCN, SiC, SiOC, SiOCN, HfO2, ZrO2, ZrAlOx, HfAlOx, HfSiOx, Al2O3, or other suitable material. In some embodiments, thickness of the etch stop layer 131 is in a range of about 1 nm to about 5 nm.

In FIG. 1B, overlying each of the gate structures 200A-200E are a conductive layer 204, an optional hard dielectric layer (not shown) and a capping layer 295. The conductive layer 204 may reduce contact resistance between a gate via 184 and the gate fill layer 290 of the gate structures 200A-200E. In some embodiments, the conductive layer 204 comprises a metal, such as tungsten, molybdenum, cobalt, ruthenium, or the like. In some embodiments, thickness of the conductive layer 204 may be in a range of about 1 nm to about 10 nm. In some embodiments, the conductive layer 204 is a part of the gate structures 200A-200E.

The capping layer 295, also referred to as a "self-aligned capping" (SAC) layer, may provide protection to the underlying gate structure 200A-200E, and may also act as a CMP stop layer when planarizing the source/drain contacts 120 following formation thereof. The capping layer 295 may be a dielectric layer including a dielectric material, such as LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, HfAlO, HfSiO, BN, or other suitable dielectric material. Between the capping layer 295 and the conductive layer 204 is the optional hard dielectric layer. The hard dielectric layer may prevent current leakage following one or more etching operations, which may be performed to form gate contacts, source/drain contacts 120, isolation structures (e.g., source/drain contact isolation structures 150), or the like. In some embodiments, the hard dielectric layer is or comprises a dielectric material that is harder than, for example, the capping layer 295, such as aluminum oxide, or other suitable dielectric material. The hard dielectric layer may also be between the capping layer 295 and the spacer layer 41. In some embodiments, over gate structures 200D, 200E and channels 22A4-22B5, the capping layer 295 may be split by a support structure 297, as shown. In some embodiments, the support structure 297 is or includes a dielectric material that is different from the dielectric material of the capping layer 295, such as LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, HfAlO, HfSiO, BN, or other suitable dielectric material.

As shown in FIG. 1B, the capping layer 295 may have an upper portion that is wider (in the X-axis direction) than a lower portion. The lower portion may be laterally between the gate spacer layers 41. In some embodiments, width (X direction) of the lower portion of the capping layer 295 is in a range of about 2 nm to about 50 nm. Width of the upper portion of the capping layer 295 in the same direction may be in a range of about 6 nm to about 150 nm. Thickness of the upper portion in the Z-axis direction may be in a range of about 1 nm to about 30 nm, or may be less than 1 nm, such as 0 nm when the upper portion is not present. In some embodiments, thickness of the lower portion is in a range of about 1 nm to about 50 nm. In some embodiments, the lower portion is not present. Generally, one or more of the upper portion or lower portion of the capping layer 295 is present over each of the gate structures 200A-200E.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

As shown in FIG. 1B, one or more source/drain vias 183 and one or more gate vias 184 may land on source/drain contacts 120 and gate structures 200A-200E, respectively. In the example shown in FIG. 1B, source/drain vias 183 land on the source/drain contact 120 shared by the GAA devices 20A, 20B and on the source/drain contact 120 shared by the GAA devices 20D, 20E. A gate via 184 lands on the gate structure 200C. The source/drain vias 183 may be or include the same material as the source/drain contacts 120. For example, the source/drain vias 183 and the source/drain contacts 120 may be or include the same of one or more of W, Ru, Co, Cu, Ti, TiN, Ta, TaN, Mo, Ni, alloys thereof or the like. In the case of an alloy, the source/drain vias 183 and the source/drain contacts 120 may be or include alloys having the substantially the same elemental components and substantially the same ratio of the elemental components. By using substantially the same material for the source/drain contacts 120 and the source/drain vias 183, contact resistance is reduced between the source/drain contacts 120 and the source/drain vias 183, which enhances circuit performance of devices (e.g., the device 10) using the described configuration. In some embodiments, width of upper surfaces of the source/drain vias 183 (e.g., in the X-direction) is in a range of about 5 nm to about 40 nm. Sidewalls of the source/drain vias 183 may be substantially vertical (e.g., perpendicular with the major surface of the substrate 110) or may be tapered, as shown in FIG. 1B.

FIG. 1C is a cross-sectional top view of the gate via 184 taken along the line C-C shown in FIG. 1B. The gate via 184 is described with reference to the gate structure 200C, as illustrated in FIG. 1C. In some embodiments, one or more of the other gate structures 200A, 200B, 200D, 200E is also in contact with an overlying gate via having substantially the same composition, structure and dimensions as the gate via 184 described herein.

With reference to FIGS. 1B and 1C, the gate via 184 includes two or more of a glue layer 184G, a metal liner layer 184M1 and a metal fill layer 184M2. The gate via 184 extends from an upper surface of a second ILD 181, through the second ILD 181, through an etch stop layer 185 under the second ILD 181 and through the capping layer 295 to an upper surface of the conductive layer 204. Sidewalls of the gate via 184 are in contact with one or more of the second ILD 181, the etch stop layer 185 when present and the capping layer 295. The lower surface of the gate via 184 is in contact with the conductive layer 204. In some embodiments, the second ILD 181 is or comprises one or more of LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO or the like. In some embodiments, thickness of the second ILD 181 in the Z-axis direction is in a range of about 3 nm to about 40 nm. In some embodiments, the etch stop layer 185 is or comprises one or more of LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO or the like. In some embodiments, thickness of the etch stop layer 185 in the Z-axis direction is in a range of about 3 nm to about 20 nm.

In some embodiments, the glue layer 184G is or includes one or more of TiN, TaN, Ru, or other suitable material. The glue layer 184G may land on (e.g., be in direct physical contact with) the conductive layer 204 on the gate structure 200C. In some embodiments, thickness of the glue layer 184G may be in a range of about 5 Angstroms to about 50

Figure 21A:
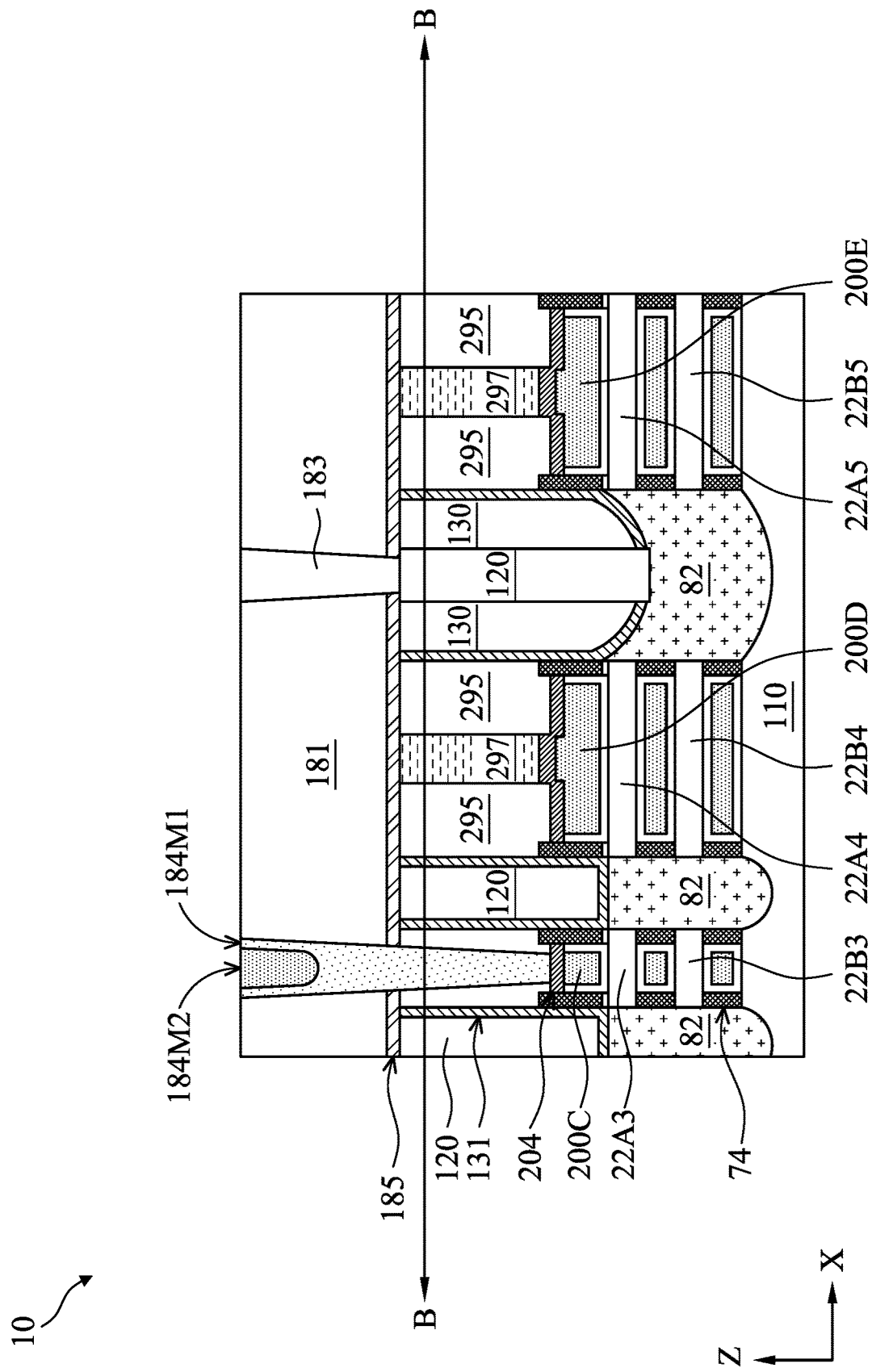

Angstroms. In some embodiments, such as is illustrated in FIG. 21A, the glue layer 184G is not present. In embodiments in which the glue layer 184G is present, the glue layer 184G is in direct contact with the second ILD 181, the etch stop layer 185 when present, the capping layer 295 and the conductive layer 204.

In some embodiments, the metal liner layer 184M1 is or includes one or more of W, Ru, Al, Mo, Ti, TiN, Cu, Co or other suitable material. In some embodiments, thickness of the metal liner layer 184M1 may be in a range of about 2 nm to about 20 nm. In some embodiments, such as is illustrated in FIG. 21A, in which the glue layer 184G is not present, the metal liner layer 184M1 is in direct contact with the second ILD 181, the etch stop layer 185 when present, the capping layer 295 and the conductive layer 204. In some embodiments in which the glue layer 184G is present, the metal liner layer 184M1 has outer sidewalls that are in direct physical contact with the glue layer 184G.

In some embodiments, the metal fill layer 184M2 has different composition than the metal liner layer 184M1, and is or includes one or more of W, Ru, Al, Mo, Ti, TiN, Cu, Co or other suitable material. In some embodiments, width of upper surfaces of the metal fill layer 184M2 (e.g., in the X-direction) is in a range of about 5 nm to about 40 nm. The metal fill layer 184M2 is generally surrounded laterally and underneath by the metal liner layer 184M1.

Figure 22A:
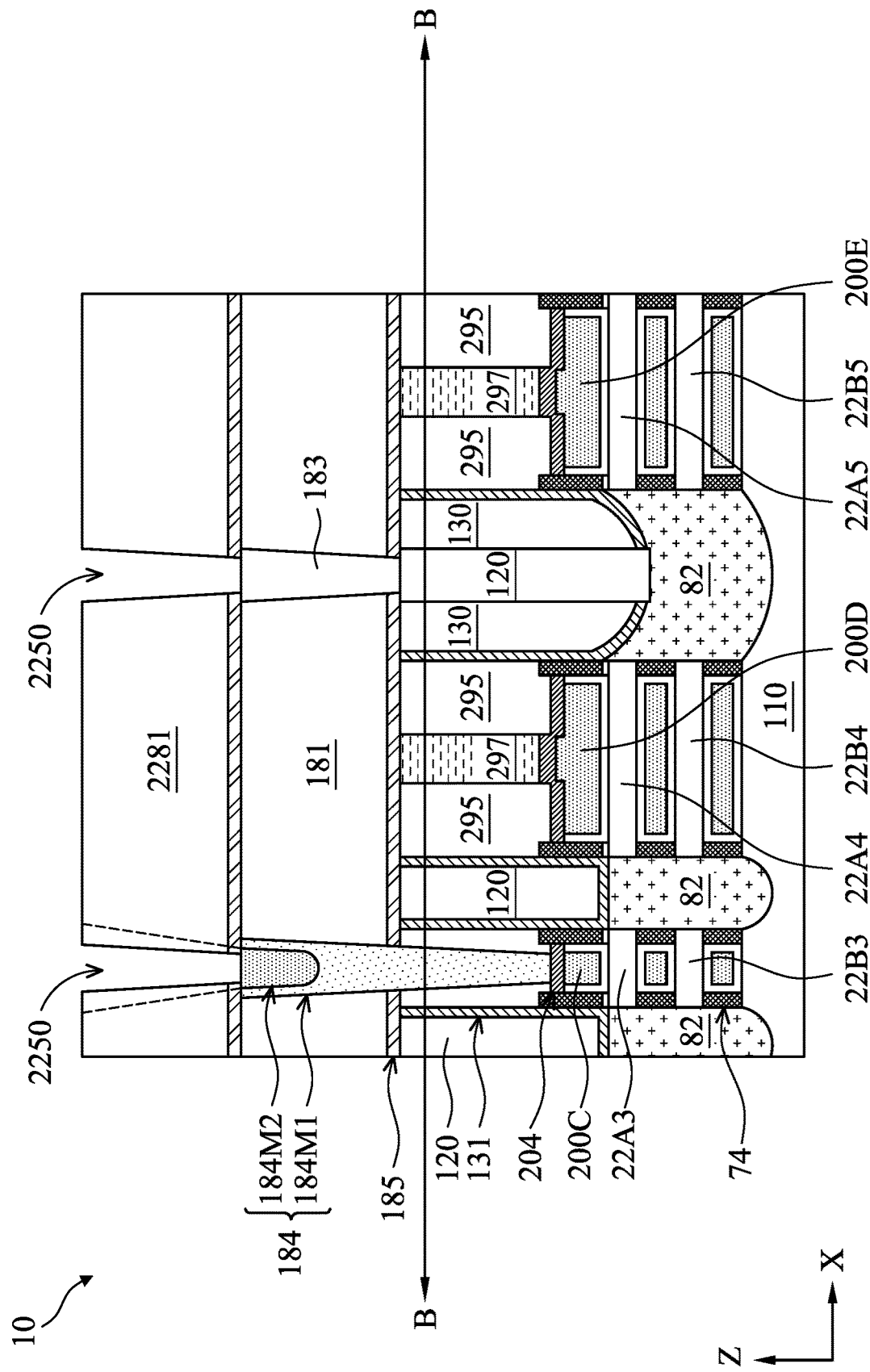
Figure 22B:
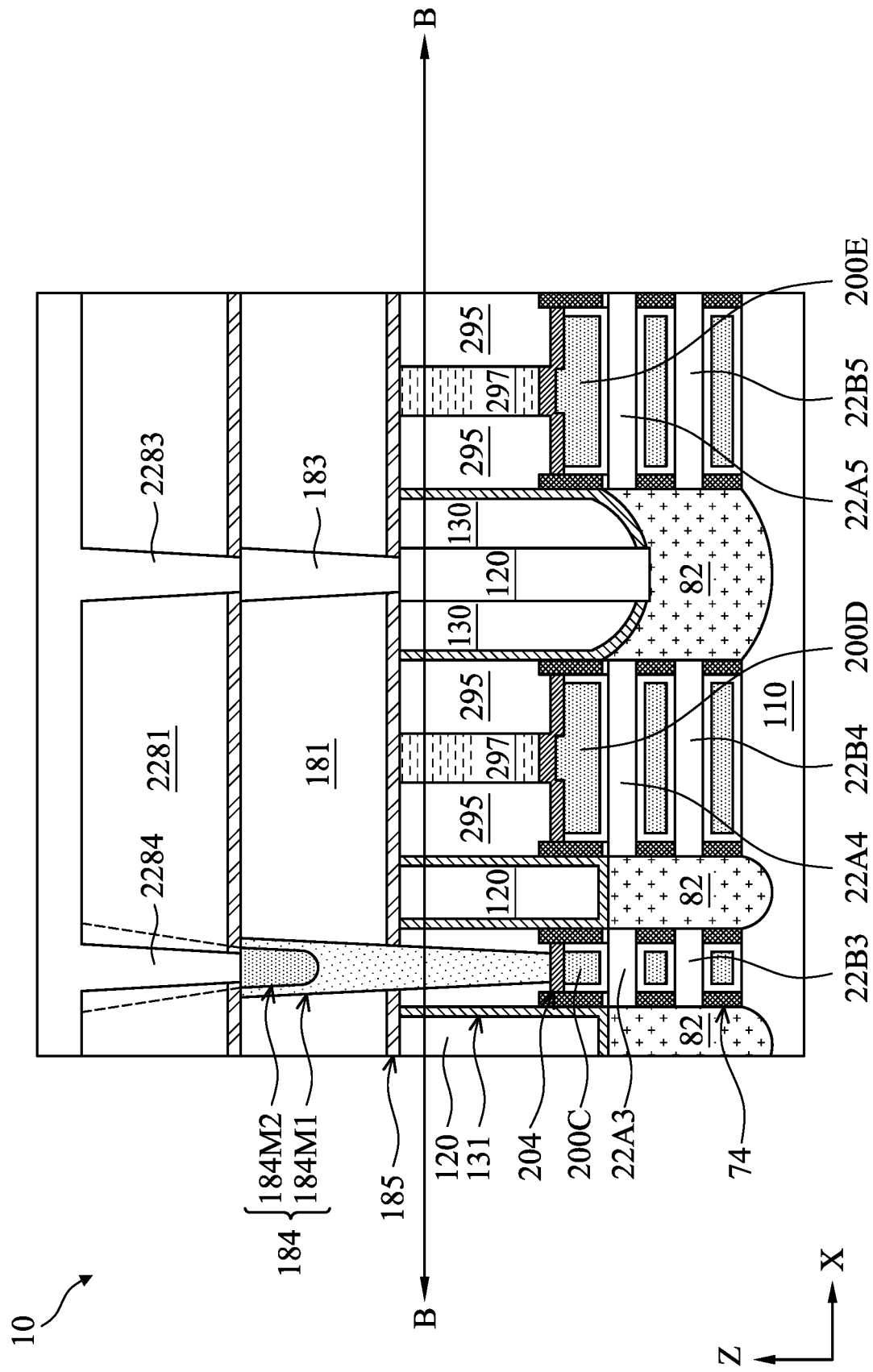
Figure 22C:
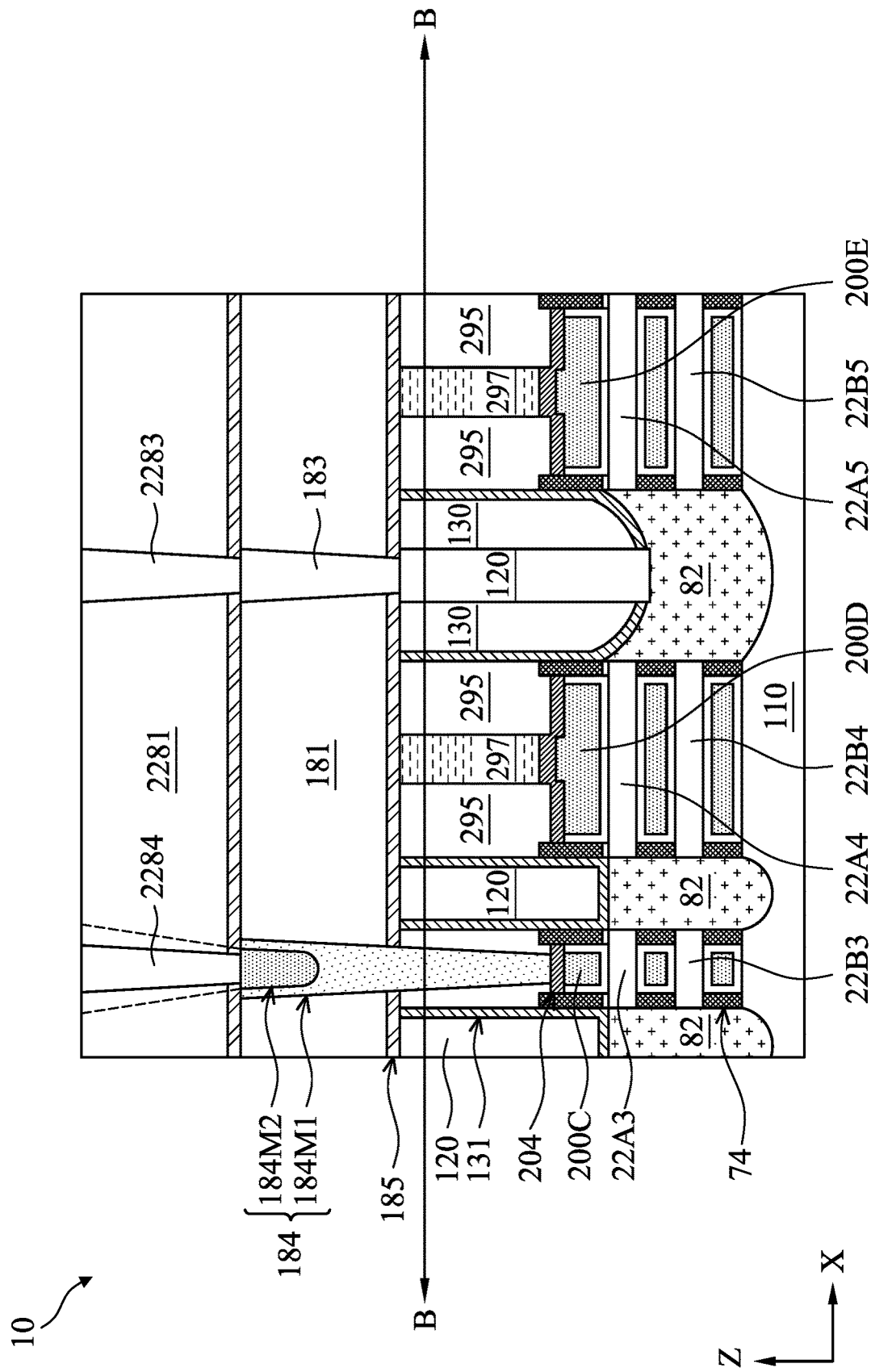
Figure 23:
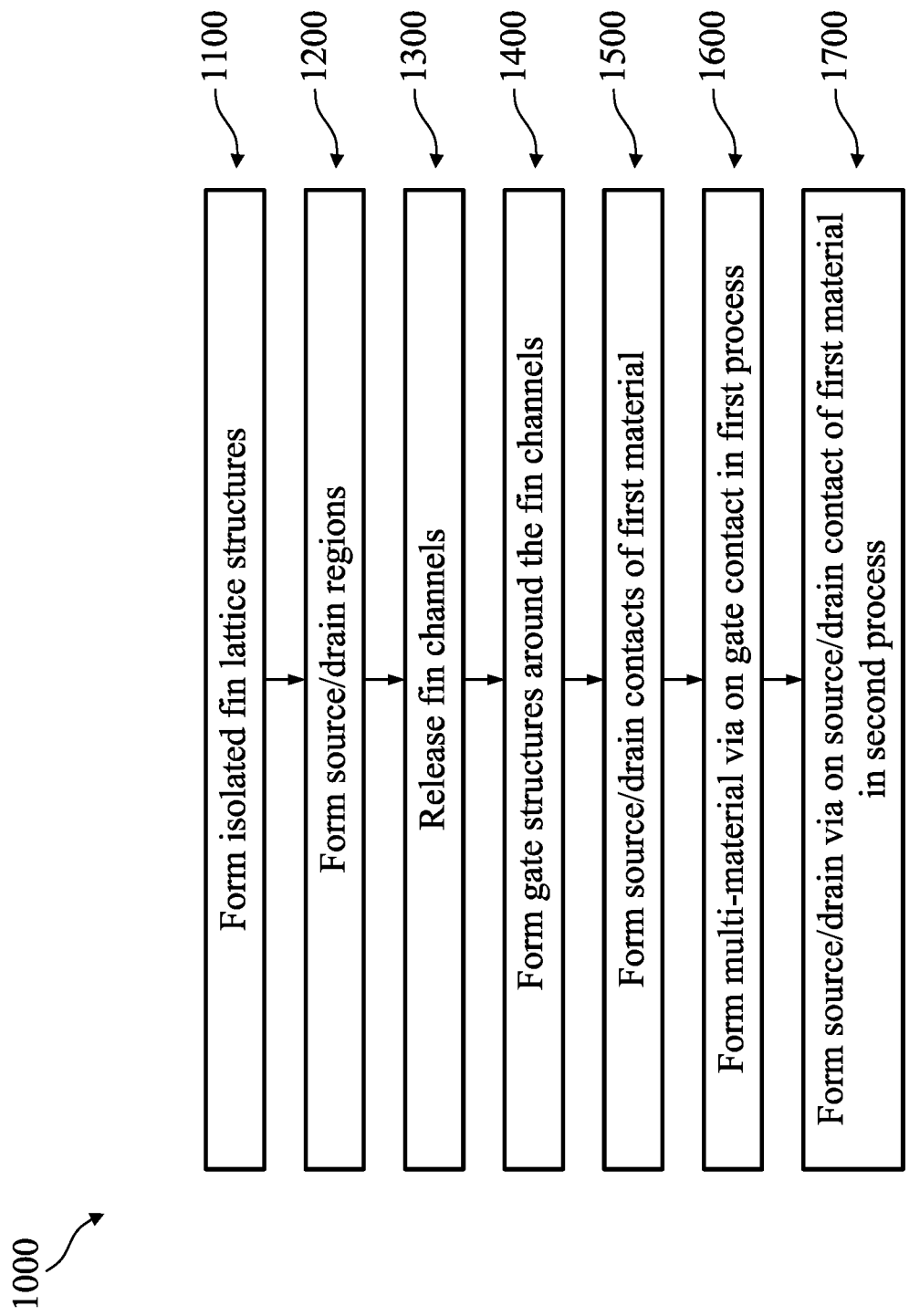
FIGS. 23, 24 is a flowchart illustrating a method of fabricating a semiconductor device according to various aspects of the present disclosure.
Figure 24:
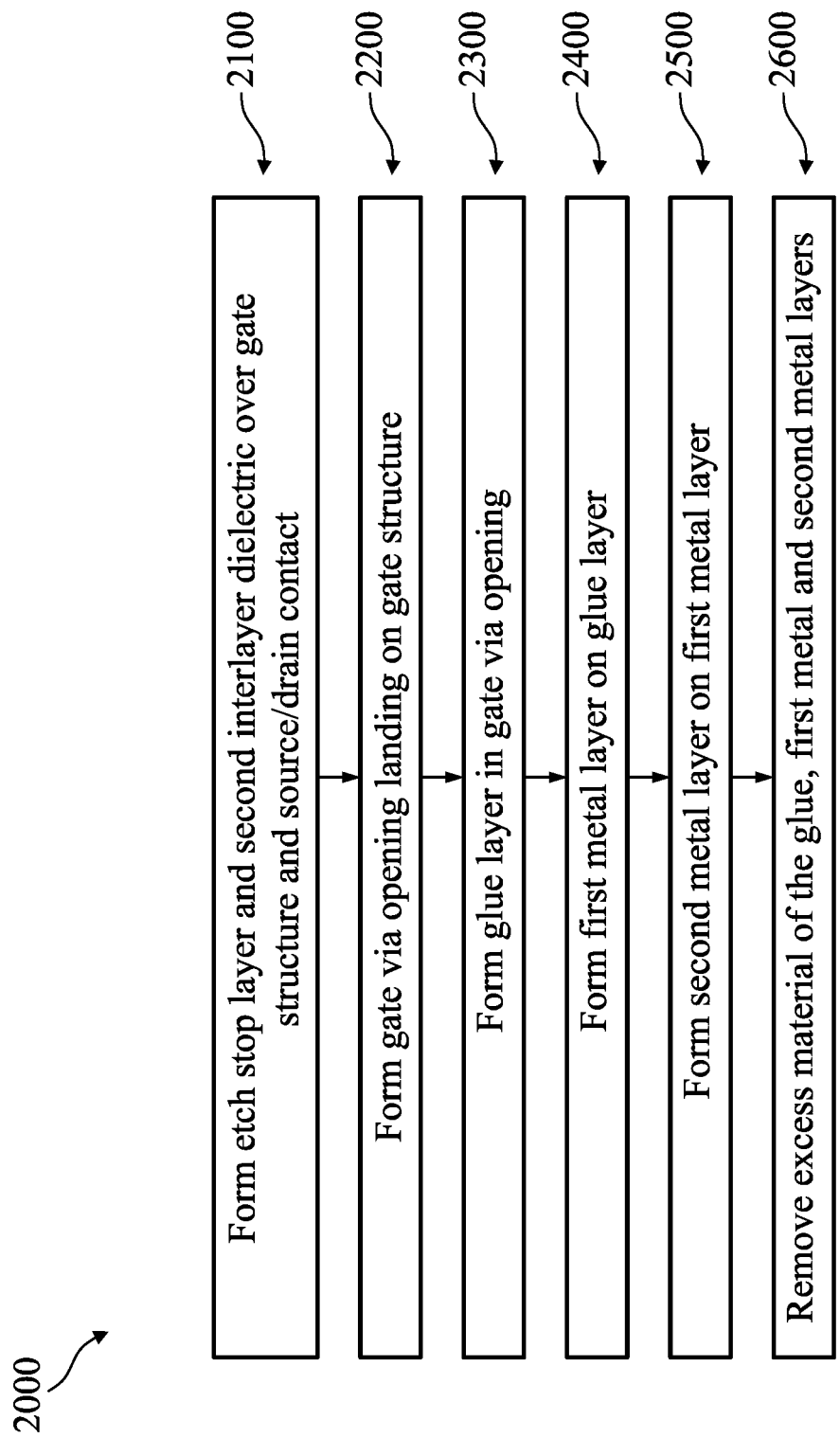

FIGS. 23, 24 illustrate flowcharts of methods 1000, 2000 for forming an IC device or a portion thereof from a workpiece, according to one or more aspects of the present disclosure. Method 1000, 2000 are merely examples and are not intended to limit the present disclosure to what is explicitly illustrated in methods 1000, 2000. Additional acts can be provided before, during and after the methods 1000, 2000 and some acts described can be replaced, eliminated, or moved around for additional embodiments of the methods. Not all acts are described herein in detail for reasons of simplicity. Method 1000, 2000 is described below in conjunction with fragmentary perspective and/or cross-sectional views of a workpiece, shown in FIGS. 2A-22, at different stages of fabrication according to embodiments of methods 1000, 2000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 11 are perspective views and cross-sectional views of intermediate stages in the manufacturing of nano-FETs, in accordance with some embodiments. FIGS. 2A, 3A, 4A, 5A, 6A, 7A, 8A, 9A, and 10A illustrate perspective views. FIGS. 2B, 3B, 4B, 5B, 6B, 7B, 8B, 9B, and 10B illustrate reference cross-section B-B' (gate cut) illustrated in FIGS. 2A, 3A, and 4A. FIGS. 4C, 5C, 6C, 7C, 8C, 9C, 10C and 11 illustrate reference cross-section C-C' (channel/fin cut) illustrated in FIG. 4A.

Figure 2B:
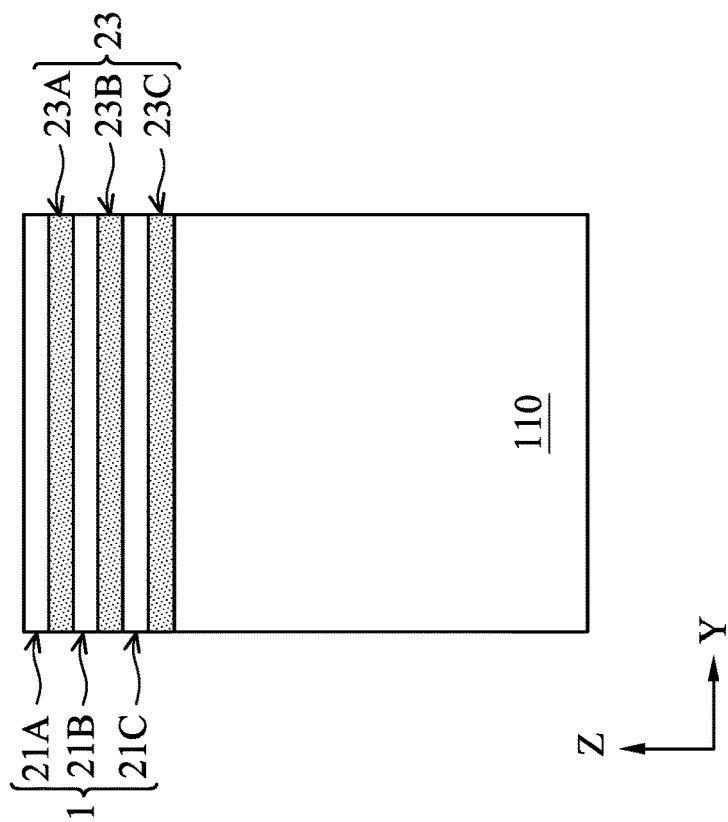
FIGS. 2A-22C are views of various embodiments of an IC device of at various stages of fabrication according to various aspects of the present disclosure.
Figure 2A:
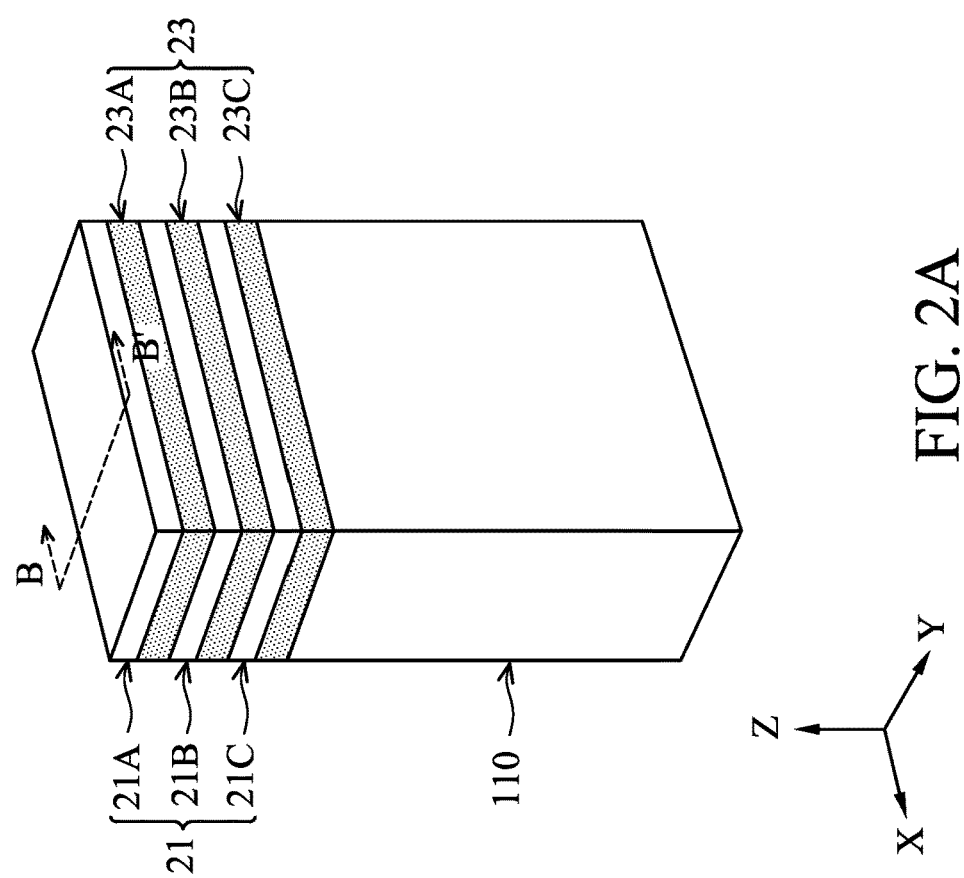

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

Figure 3B:
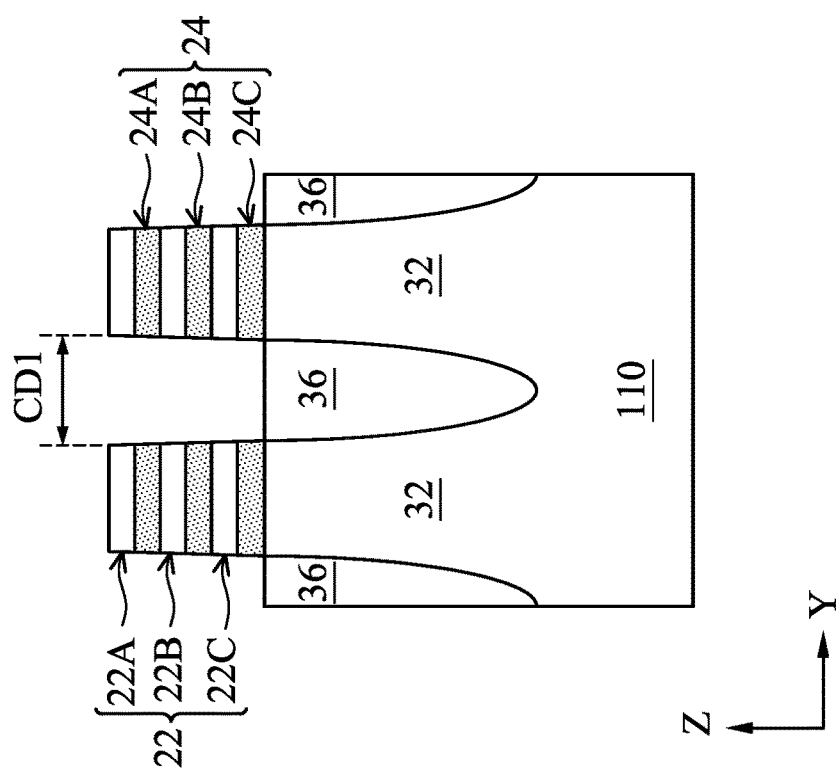
Figure 3A:
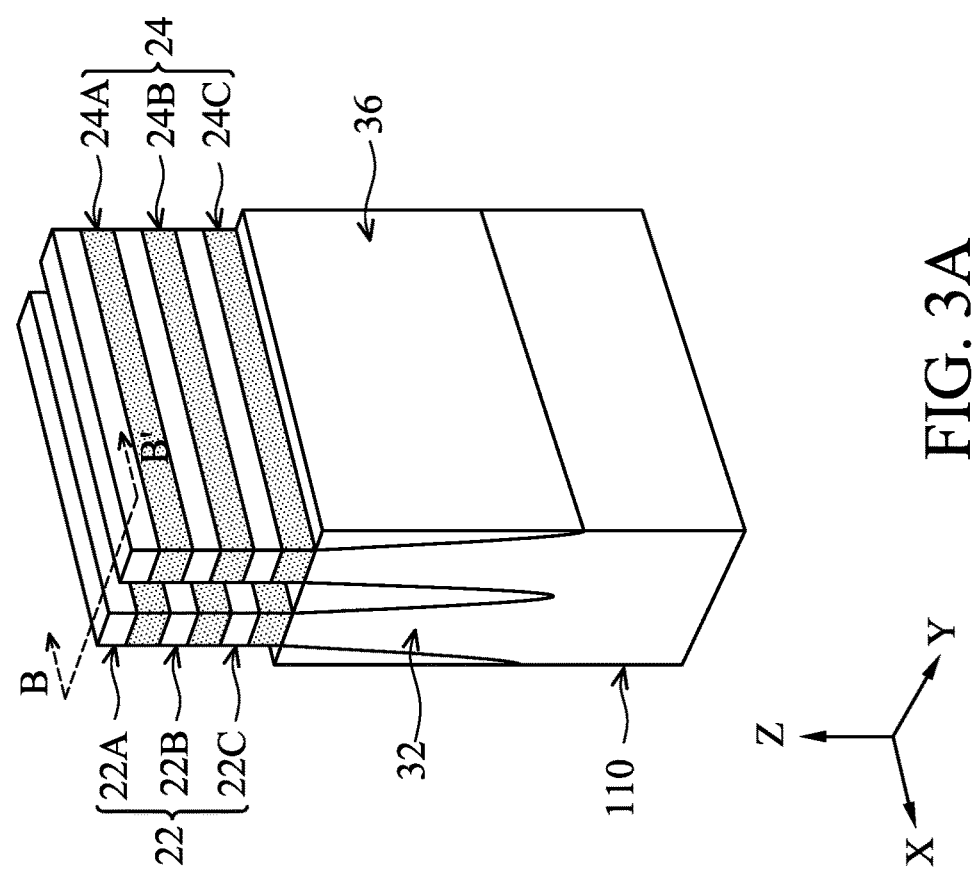

In FIG. 3A and FIG. 3B, fins 32 are formed in the substrate 110 and nanostructures 22, 24 are formed in the multi-layer stack 25 corresponding to act 1100 of FIG. 23. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance CDI between adjacent fins 32 and nanostructures 22, 24 may be from about 18 nm to about 100 nm. A portion of the device 10 is illustrated in FIGS. 3A and 3B including two fins 32 for simplicity of illustration. The device 10 shown in FIGS. 1A-1D is shown including three fins 322-324. The process 1000 illustrated in FIGS. 2A-11 may be extended to any number of fins, and is not limited to the two fins 32 shown in FIGS. 3A-11 nor to the three fins 322-324 shown in FIG. 1D.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Figure 4C:
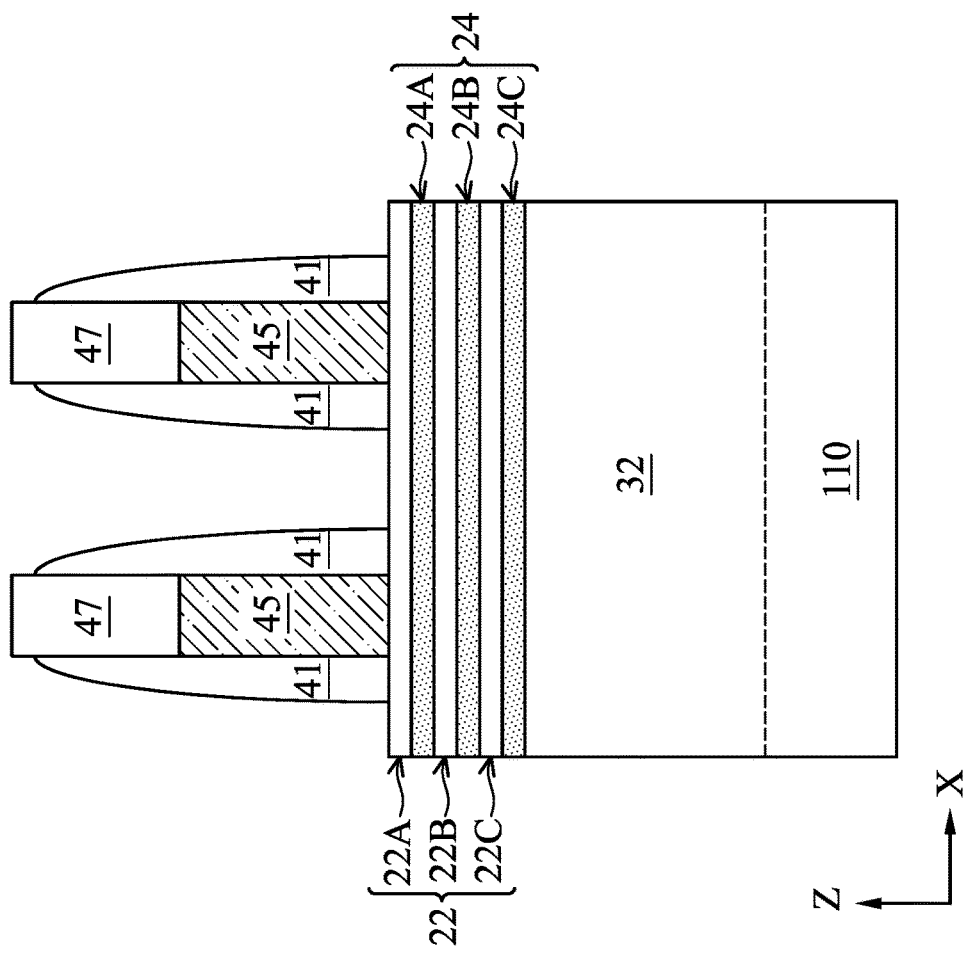
Figure 4B:
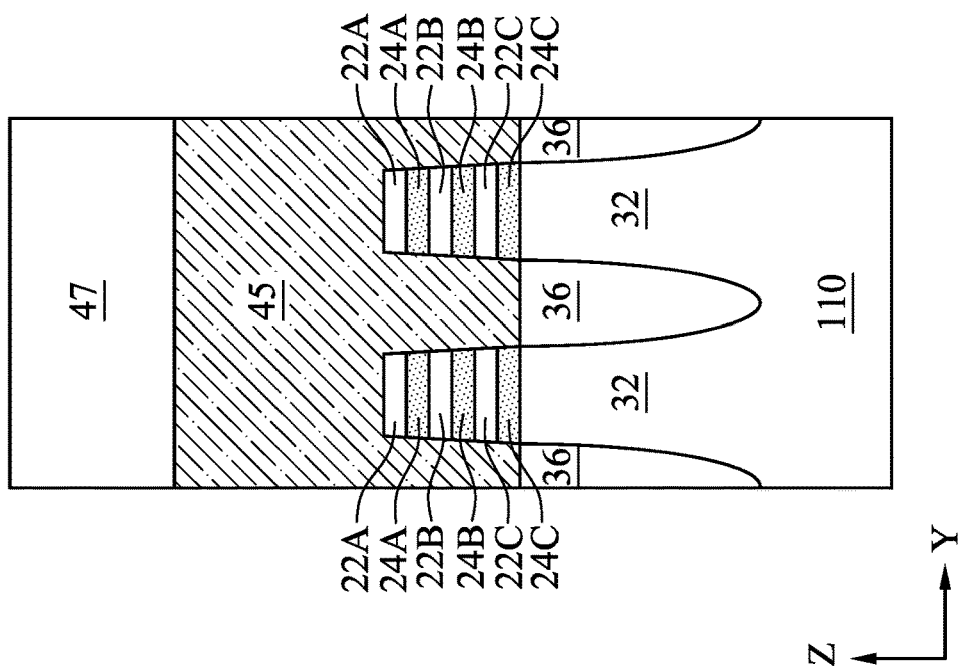

In FIGS. 4A-4C, dummy (or "sacrificial") gate structures 40 are formed over the fins 32 and/or the nanostructures 22, 24. A dummy gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 22, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

FIGS. 4A-4C illustrate one process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate, such as any of the gate structures 200A-200E.

Figure 5A:
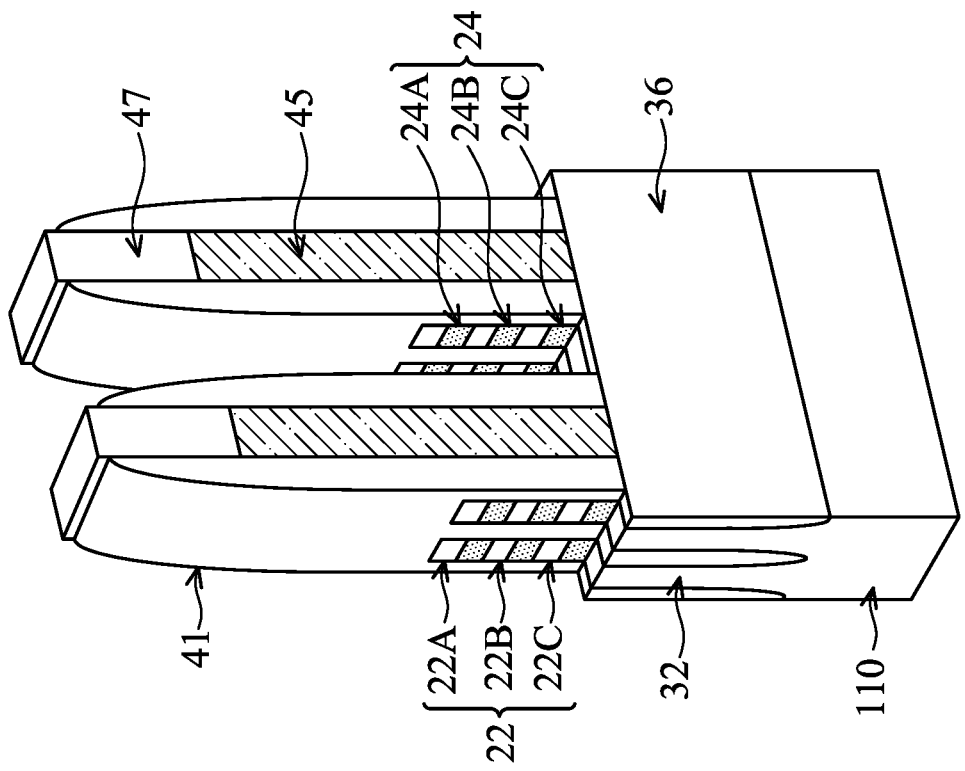
Figure 5C:
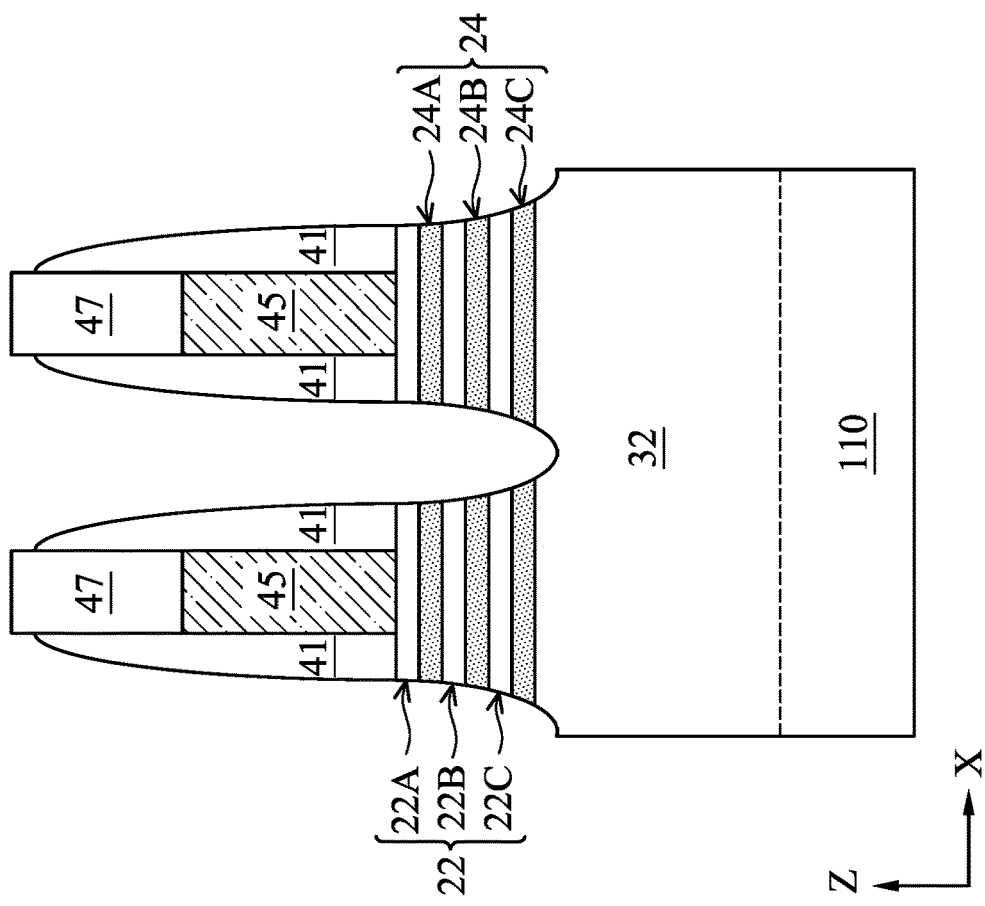
Figure 5B:
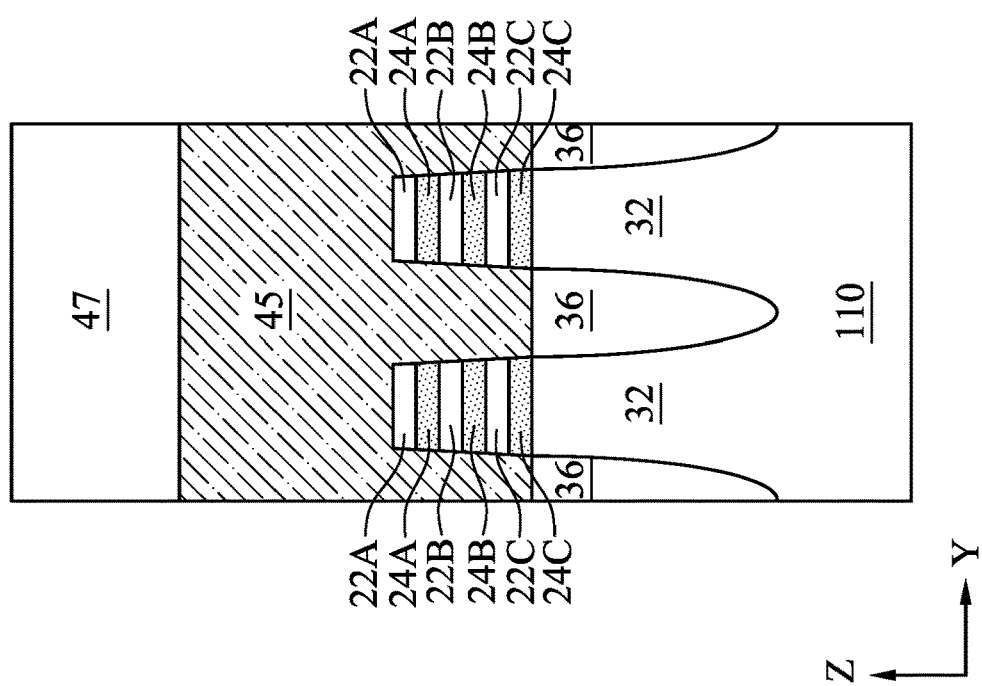

In FIGS. 5A-5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments. FIG. 5C shows two vertical stacks of nanostructures 22, 24 following the etching process for simplicity. FIGS. 1B, 1D, 1F show five vertical stacks of nanostructures 22 (nanostructures 24 are replaced by gate structures 200A-200E). In general, the etching process may be used to form any number of vertical stacks of nanostructures 22, 24 over the fins 32 (or over the fins 322-324).

Figure 6A:
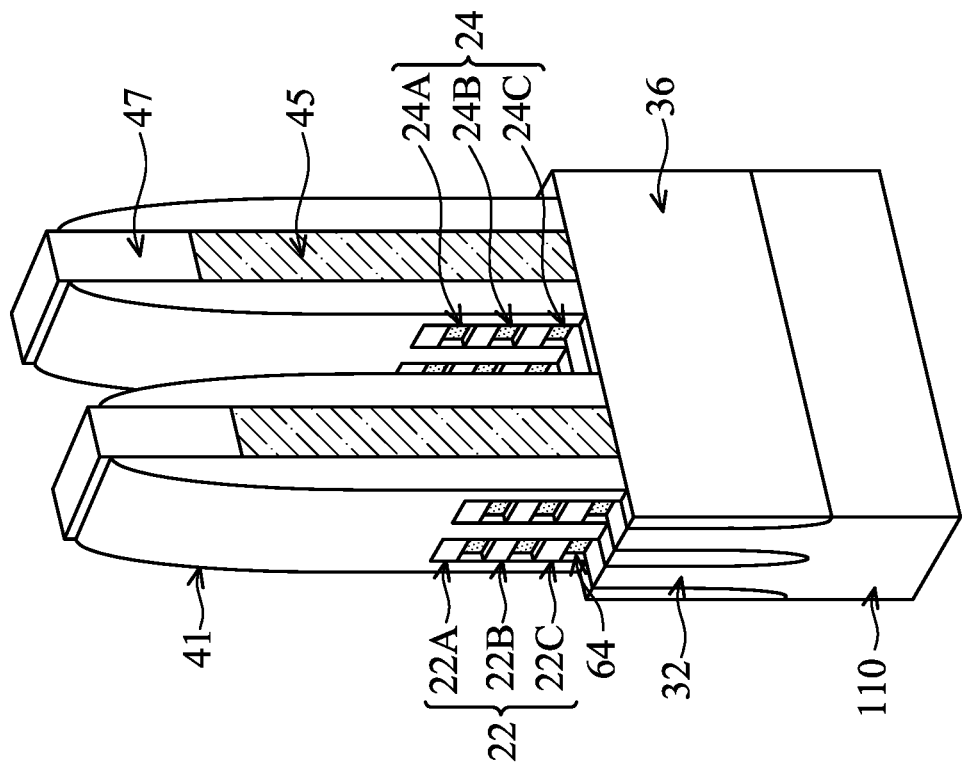
Figure 6C:
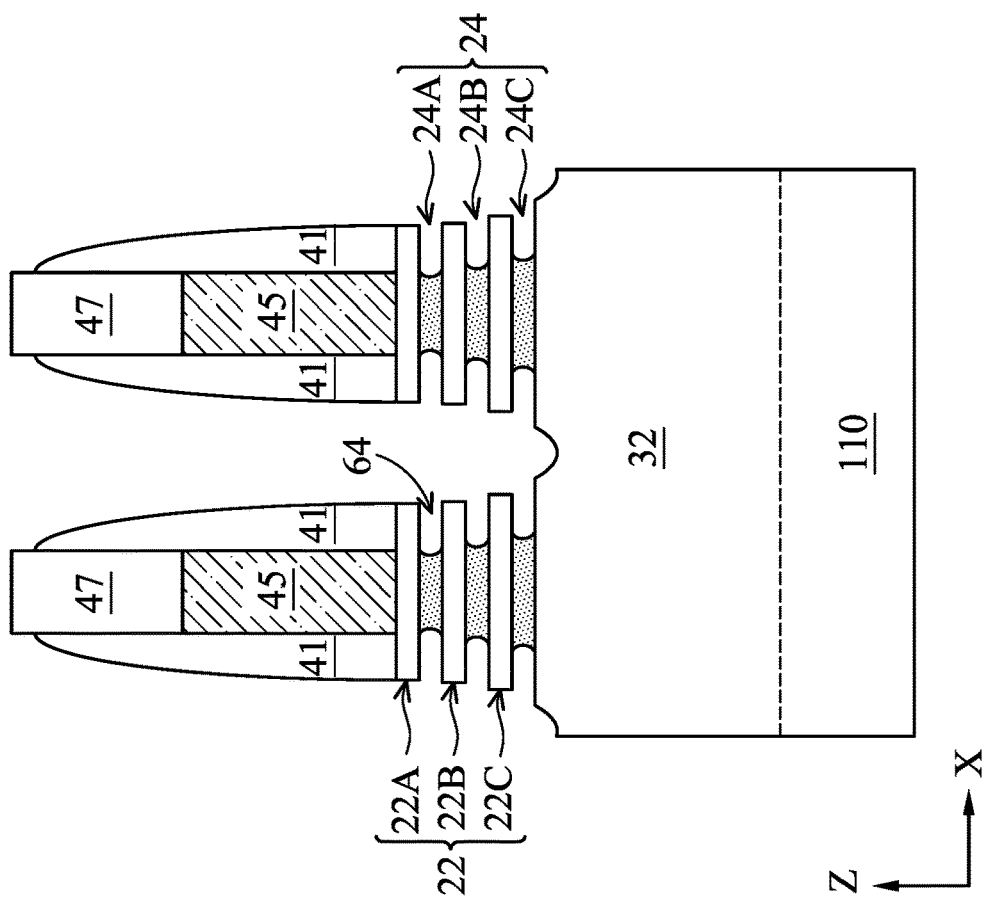
Figure 6B:
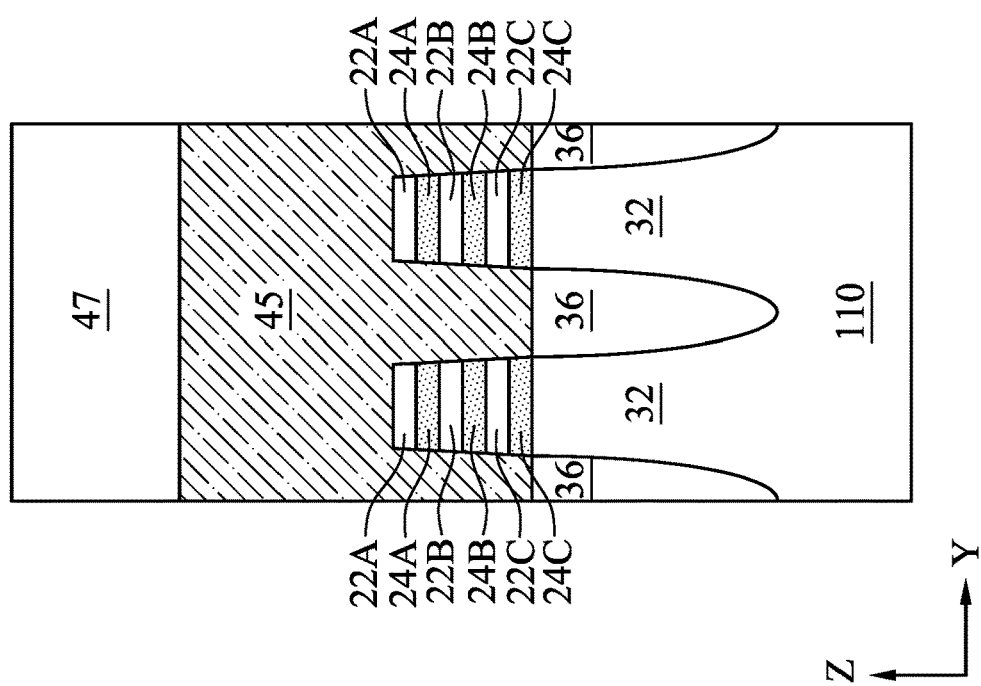

FIGS. 6A-6C and 7A-7C illustrate formation of inner spacers 74. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A-6C.

Figure 7A:
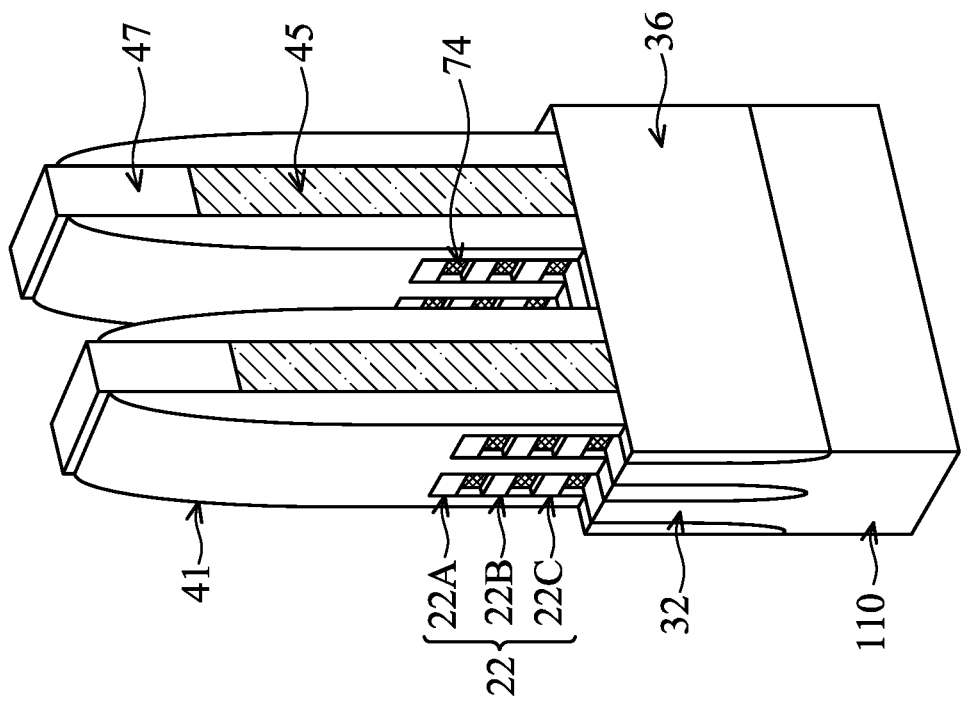
Figure 7C:
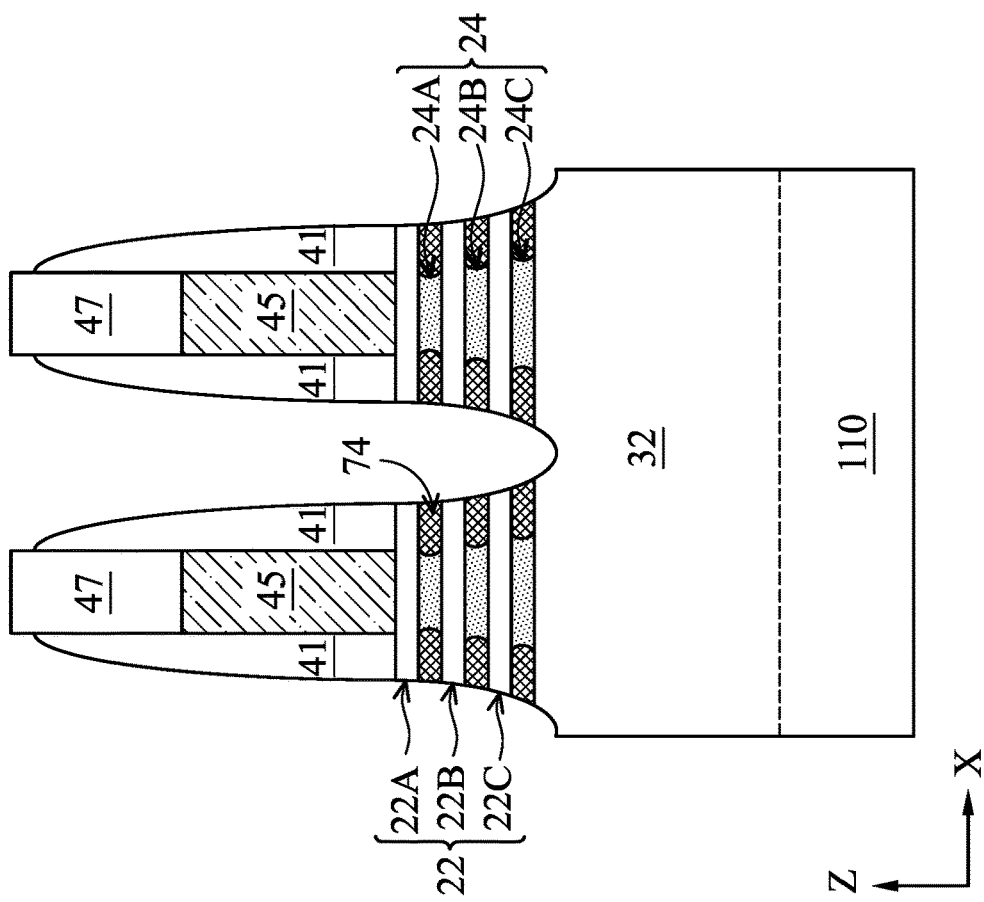
Figure 7B:
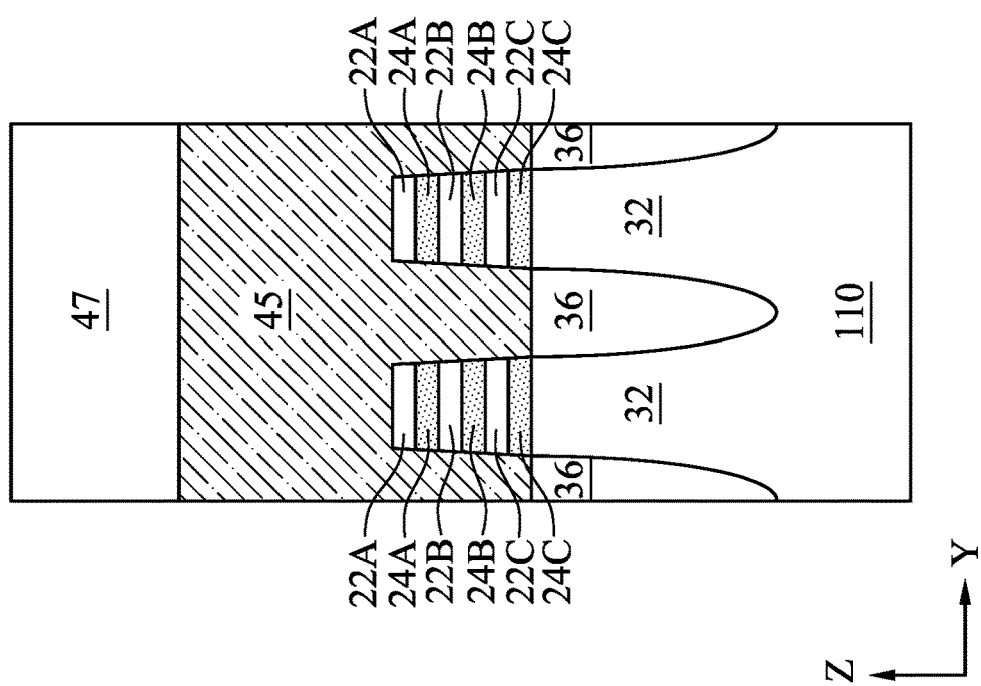

Next, an inner spacer layer is formed to fill the recesses 64 in the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7C.

Figure 8A:
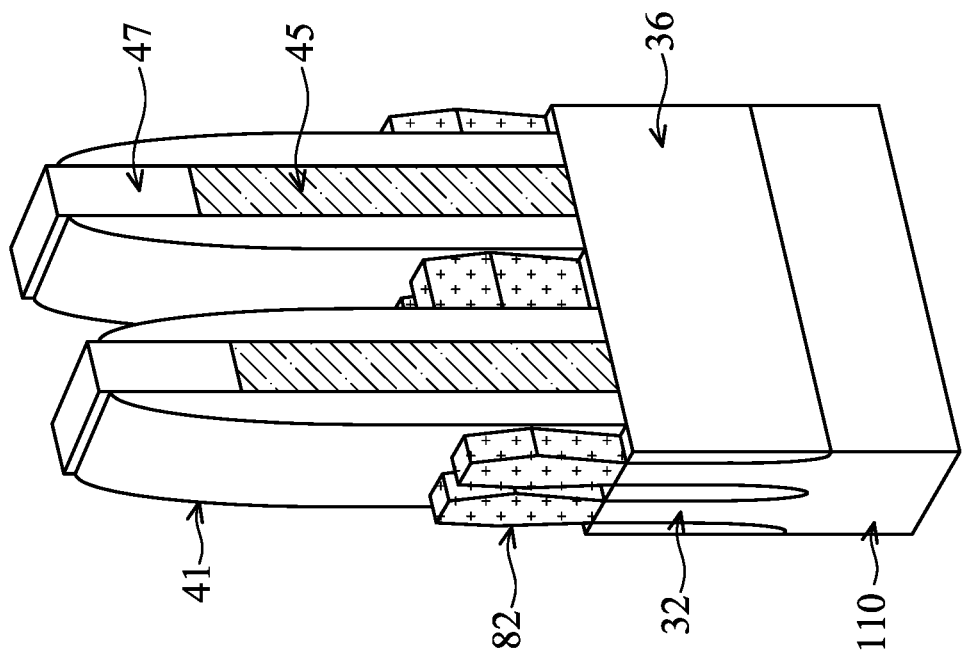
Figure 8C:
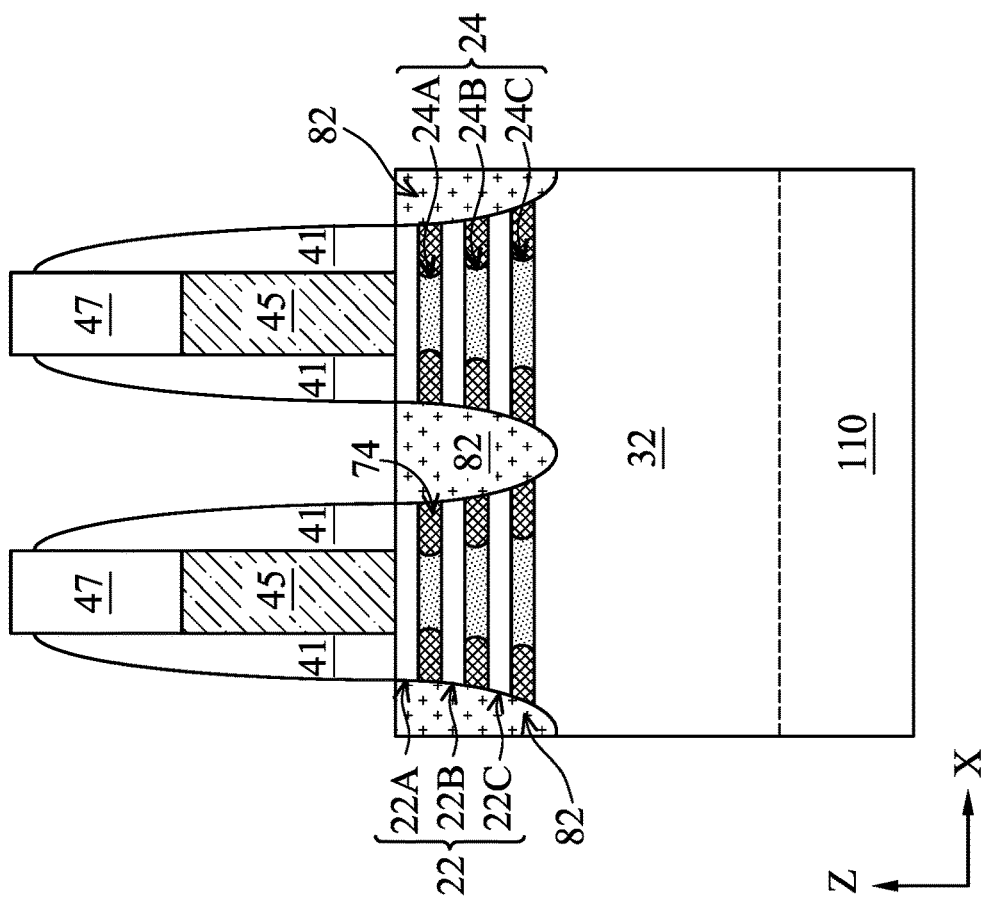
Figure 8B:
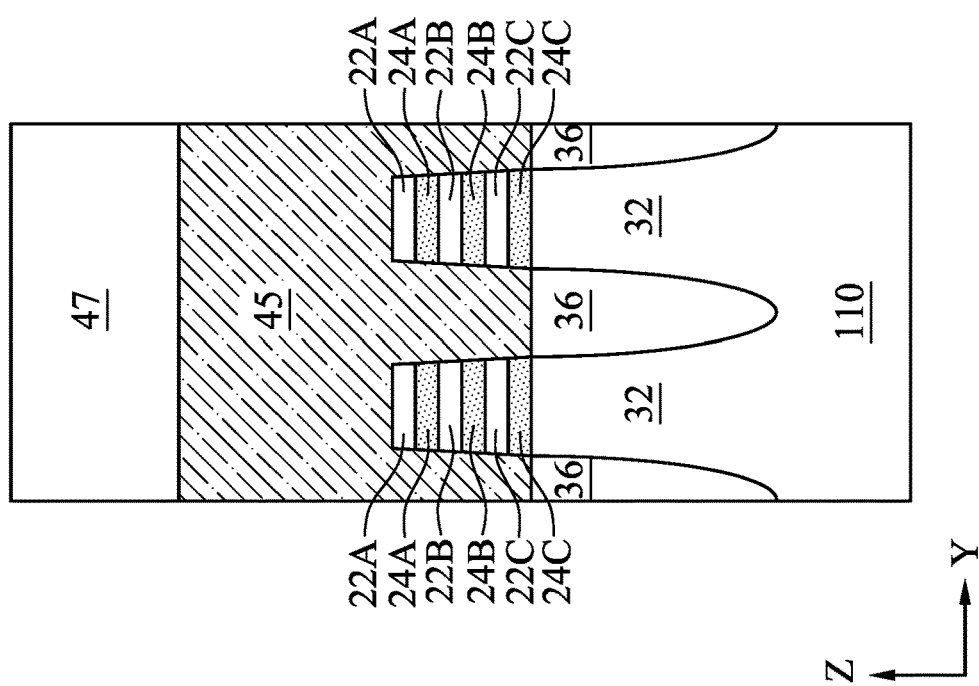

FIGS. 8A-8C illustrate formation of source/drain regions 82 corresponding to act 1200 of FIG. 23. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) 131 and interlayer dielectric (ILD) 130, shown in FIG. 11, may then be formed covering the dummy gate structures 40 and the source/drain regions 82. The CESL 131 and ILD 130 are omitted from FIGS. 8A-10C for simplicity of illustration.

Figure 9A:
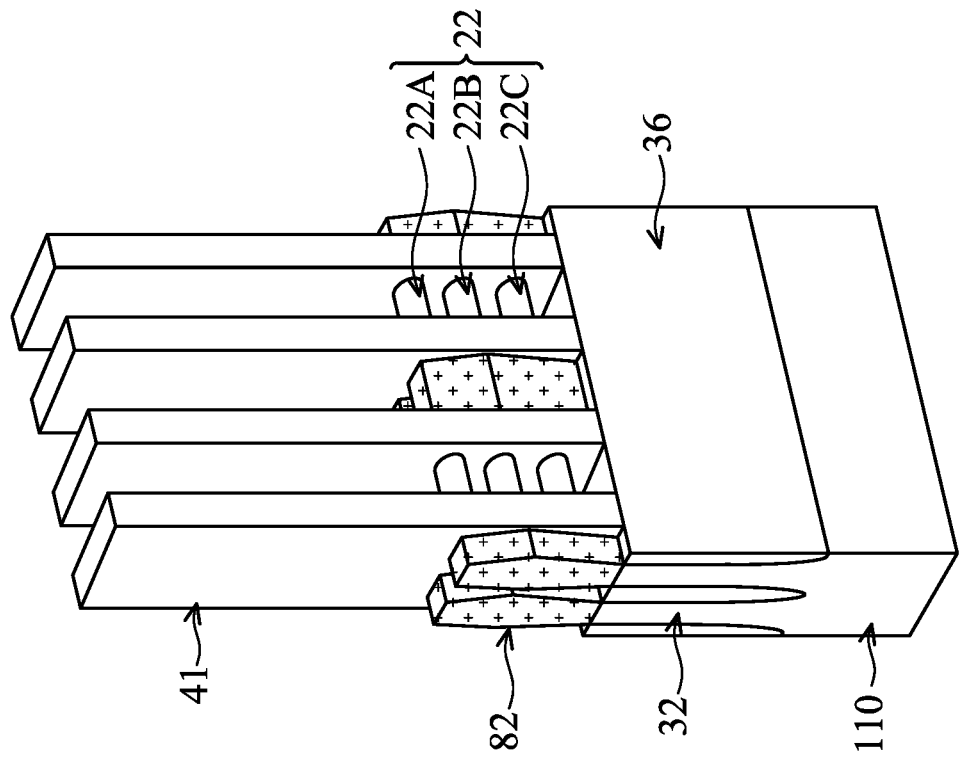
Figure 9C:
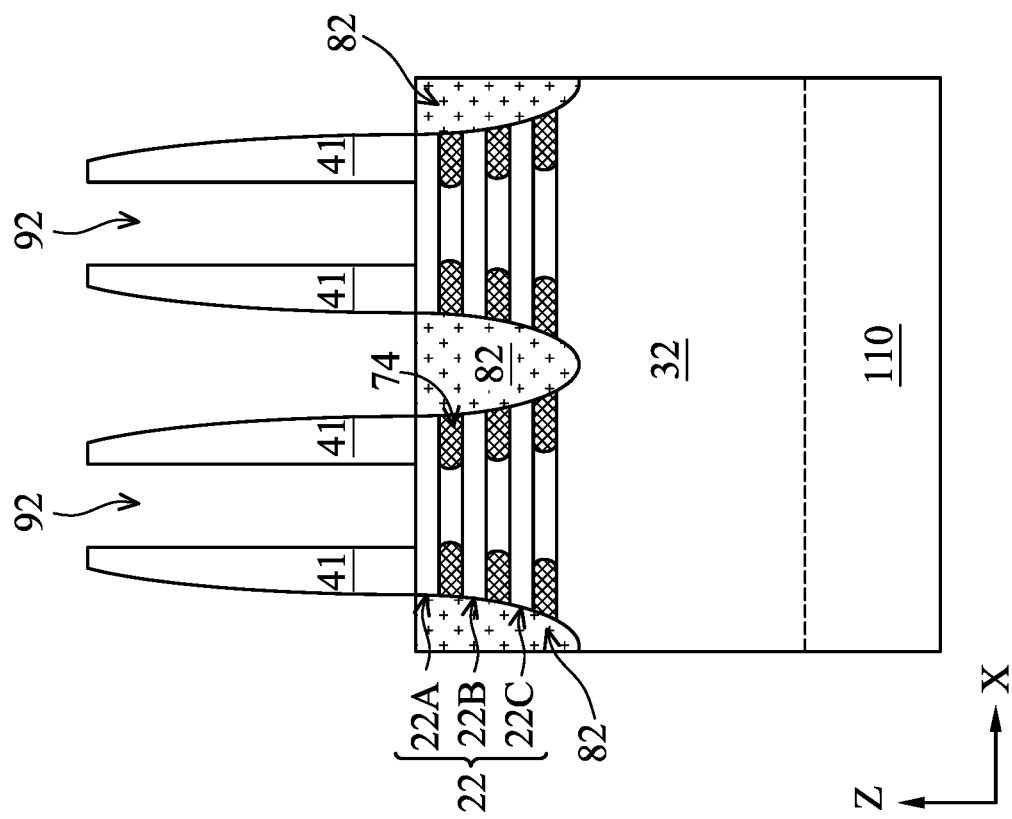
Figure 9B:
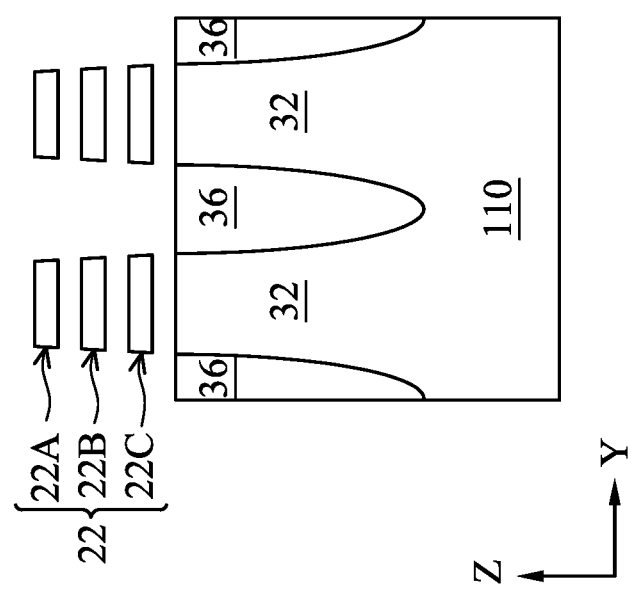

FIG. 9A, FIG. 9B, and FIG. 9C illustrate release of fin channels 22A-22C by removal of the nanostructures 24A-24C, the mask layer 47, and the dummy gate layer 45, which corresponds to act 1300 of FIG. 23. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the GAA devices 20A-20E formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g., thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 10A:
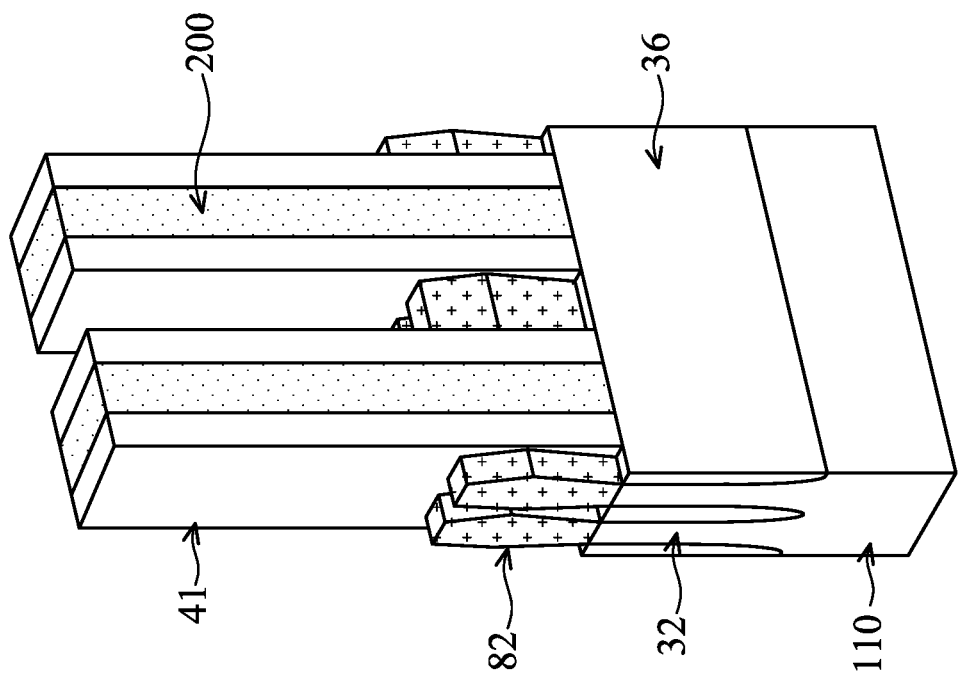
Figure 10A:
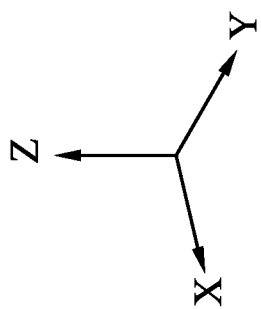
Figure 10C:
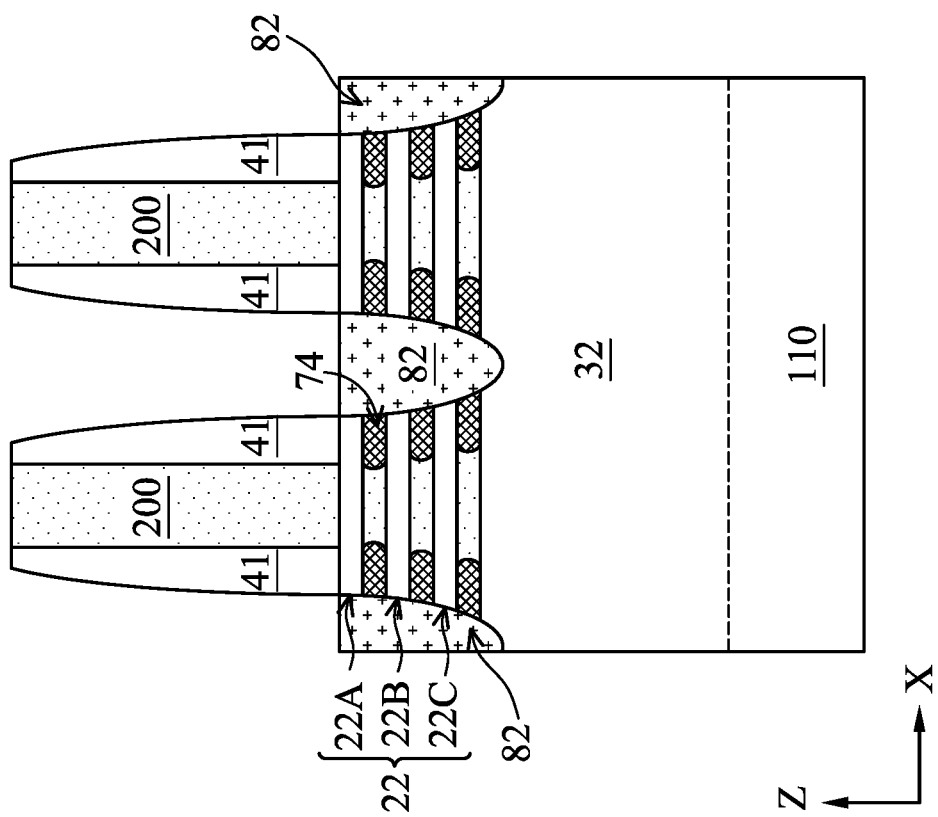
Figure 10B:
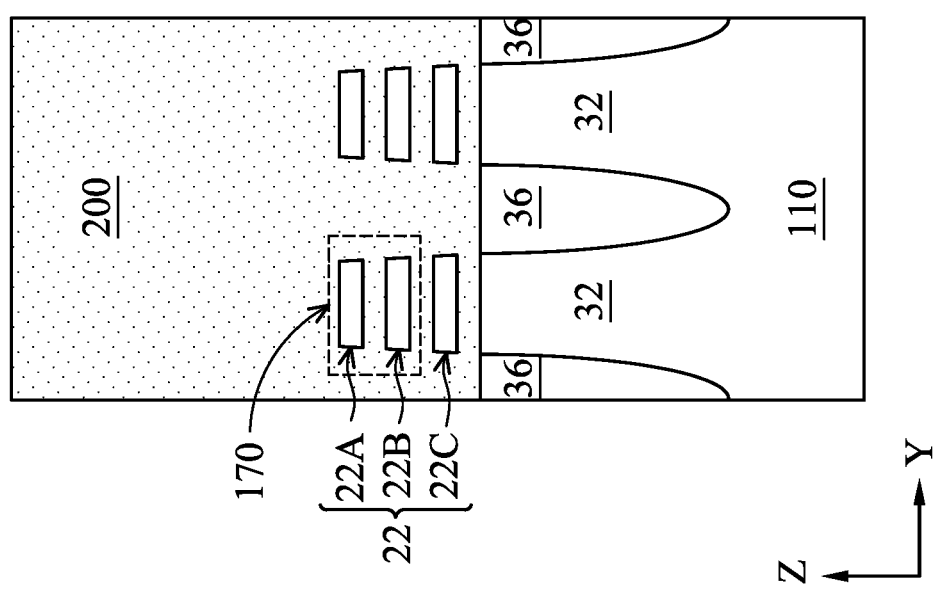
Figure 11:
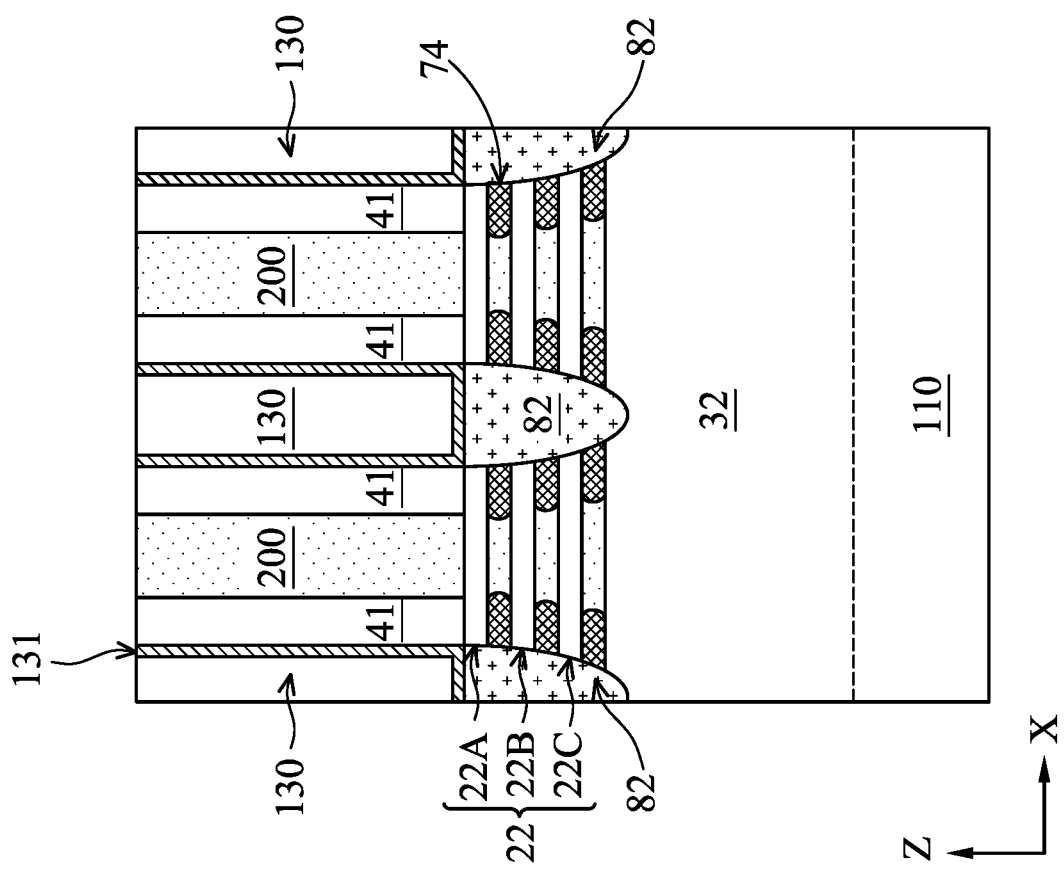

In FIGS. 10A-10C, replacement gates 200 are formed, corresponding to act 1400 of FIG. 23. FIG. 12 is a detailed view of the region 170 of FIG. 10B corresponding to a portion of the gate structure 200. The gate structure 200 generally includes the interfacial layer (IL, or "first IL"

below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 12, in some embodiments, the first IL 210 includes an oxide of the semiconductor material of the substrate 110, e.g., silicon oxide. In other embodiments, the first IL 210 may include another suitable type of dielectric material. The first IL 210 has a thickness in a range between about 5 angstroms and about 50 angstroms.

Still referring to FIG. 12, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the GAA devices 20A-20E.

With further reference to FIG. 12, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of WCls, followed by an Ar purge, followed by a second pulse of $O_2$, followed by another Ar purge. The high-k capping layer is removed to increase gate fill window for further multiple threshold voltage tuning by metal gate patterning.

Further in FIG. 12, after forming the second IL 240 and removing the high-k capping layer, the work function barrier layer 700 is optionally formed on the gate structure 200, in accordance with some embodiments. The work function barrier layer 700 is or comprises a metal nitride, such as TIN, WN, MON, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TIN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 12 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MON, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A, 22B. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A, 22B.

FIGS. 13A-21B illustrate formation of the source/drain vias 183 and the gate via 184 in accordance with various embodiments. While the figures show the source/drain via 183 formed following the gate via 184, in some embodiments, the gate via 184 is formed following formation of the source/drain via 183.

FIGS. 13B, 14B, 15B, 16B, 17B, 18B, 19B, 20B and 21B are cross-sectional top views of the device 10 taken along the line B-B shown in FIGS. 13A, 14A, 15A, 16A, 17A, 18A, 19A, 20A and 21A. FIGS. 13A, 14A, 15A, 16A, 17A, 18A, 19A, 20A and 21A are cross-sectional side views of the device 10 taken along the line A-A shown in FIGS. 13B, 14B, 15B, 16B, 17B, 18B, 19B, 20B and 21B.

Figure 13A:
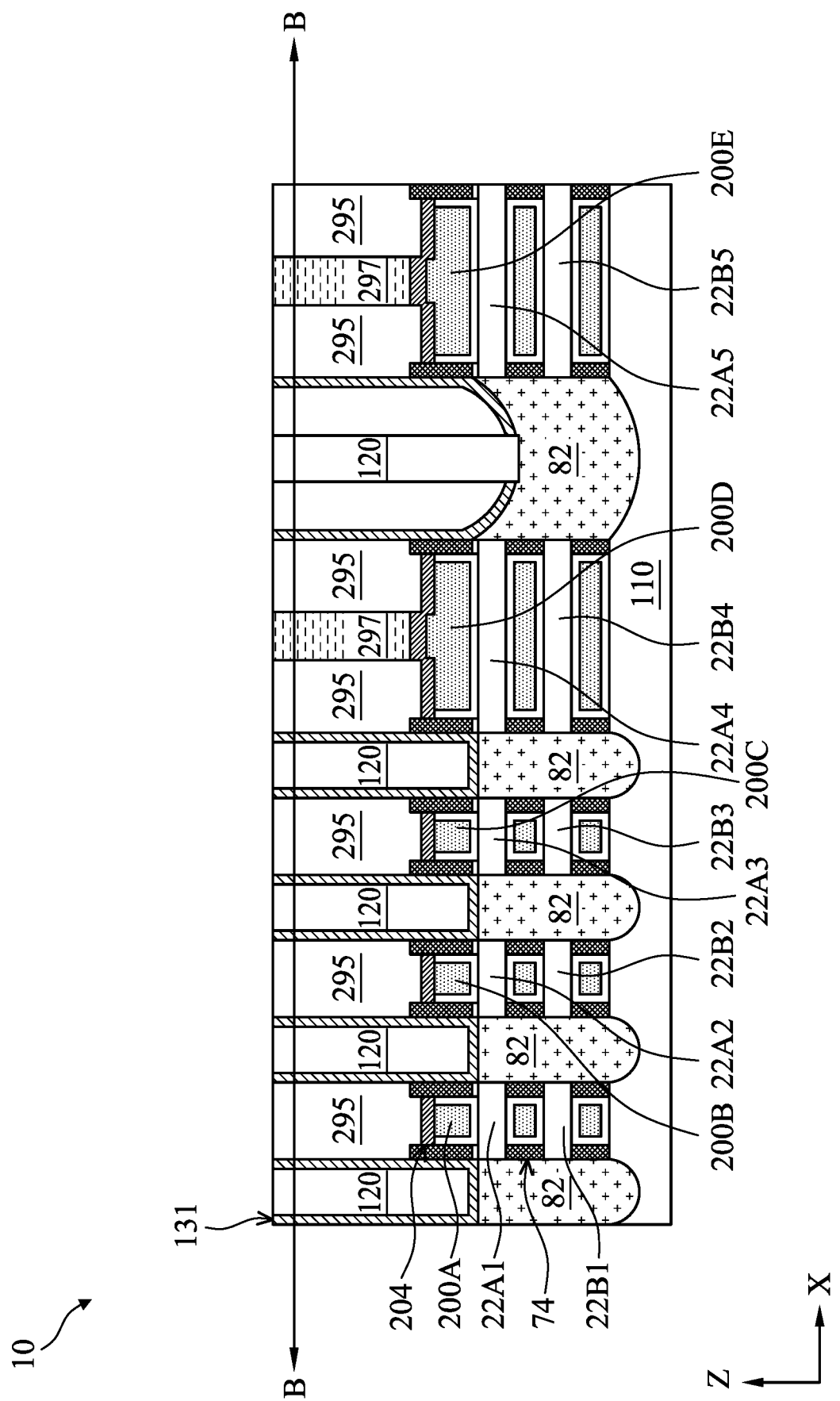
Figure 13B:
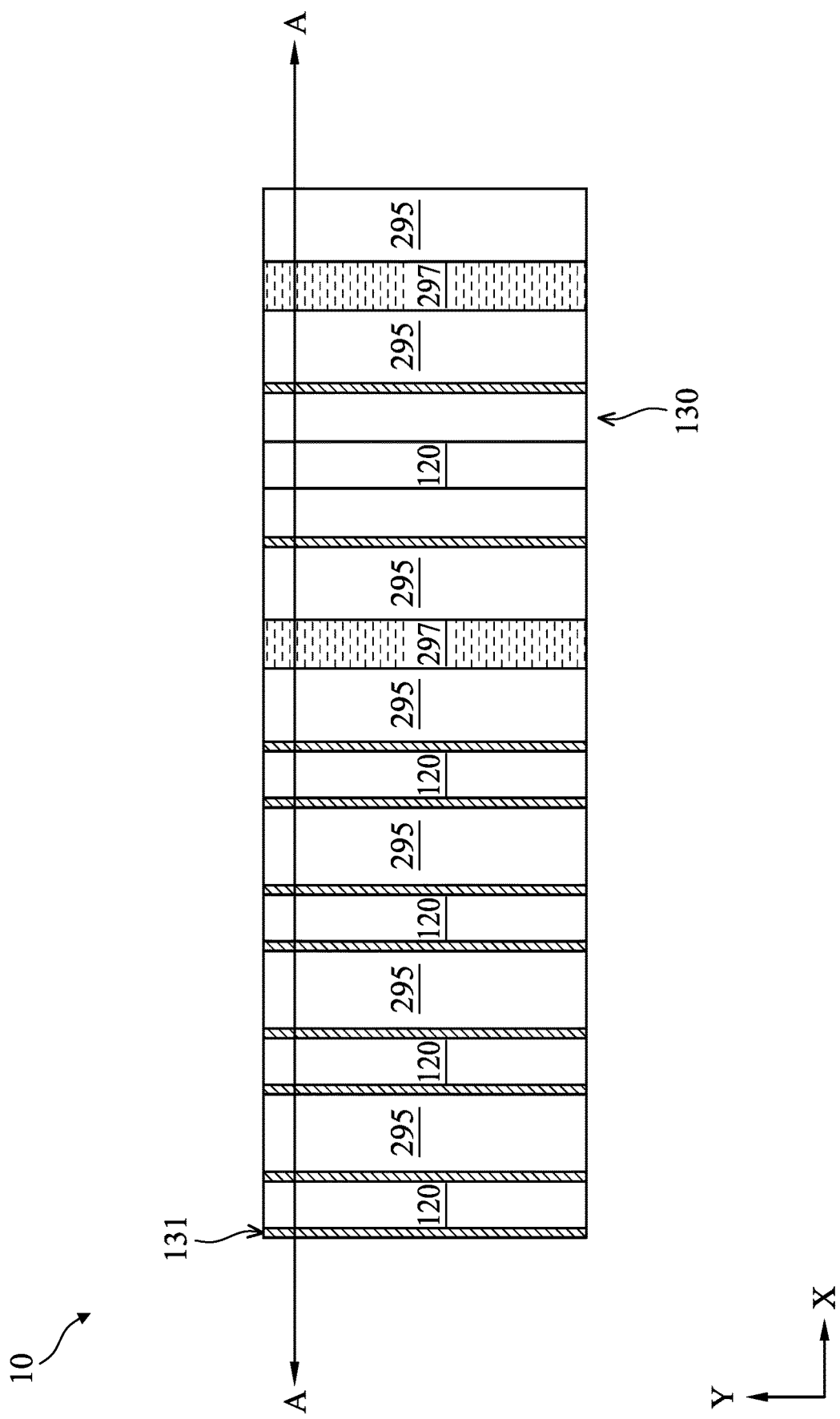

In FIGS. 13A and 13B, following formation of the gate structures 200A-200E, additional processing may be performed such that overlying the gate dielectric layer 600 and the gate fill layer 290 are the conductive layer 204, an optional hard dielectric layer (not shown), and the capping layer 295. The conductive layer 204 reduces contact resistance between the gate via 184 to be formed and the gate fill layer 290. The conductive layer 204 may be formed by depositing any of the materials listed by a suitable deposition process, such as PVD, CVD, ALD or the like. Following formation of the conductive layer 204 on the upper surface of the gate structures 200A-200E, the optional hard dielectric layer may be formed as a conformal liner layer on sidewalls of the etch stop layer 131, the spacer layer 41 and the conductive layer 204. In some embodiments, the hard dielectric layer is formed by PVD, CVD, ALD or the like. The capping layer 295 is then formed over the hard dielectric layer, when present, or over the conductive layer 204 and abutting sidewalls of the ESL 131 and the spacer layer 41. The capping layer 295 may be formed by PVD, CVD, ALD or the like.

Further to FIGS. 13A and 13B, the source/drain contacts 120 are formed through the ILD 130 and the ESL 131, corresponding to act 1500 of FIG. 23. In some embodiments, formation of the source/drain contacts 120 includes masking the device 10, forming openings in the mask by removing portions of the mask overlying the ILD 130, and forming openings in the portions of the ILD 130 exposed by the mask by one or more etching processes. Removal of the portions of the ILD 130, e.g., by etching, may terminate on the etch stop layer 131, exposing the etch stop layer 131. Following exposure of the etch stop layer 131, one or more etching processes may be performed to break through the etch stop layer 131, exposing the source/drain region 82. The source/drain contacts 120 may then be formed by depositing material of the source/drain contacts 120 in the opening exposing the source/drain region 82. In some embodiments, the silicide 118 is formed prior to, or as part of, depositing the material of the source/drain contacts 120. The material may include one or more of W, Ru, Mo, Co, Cu, an alloy thereof or the like. The silicide 118 formed may include WSi, RuSi, MoSi, NiSi, TiSi, or another appropriate silicide material. In some embodiments, the source/drain contacts 120 may have substantially vertical sidewalls (e.g., perpendicular to the major surface of the substrate), as shown. In some embodiments, one or more of the source/drain contacts 120 may have tapered sidewalls (e.g., at a non-90° angle with the major surface of the substrate). For example, as shown in FIG. 1B, source/drain contacts 120 in higher density regions of the device 10, such as between the gate structures 200A, 200B, may have substantially vertical sidewalls due to the ILD 130 being completely removed between the ESL 131. In lower density regions, for example between longer channels 22A4-22B5, the source/drain contact 120 may have tapered sidewalls, as shown in FIG. 1B.

With reference to FIG. 1A, in some embodiments, the source/drain contact isolation features 150 are formed prior to depositing the material. For example, the source/drain contact isolation features 150 may be formed by selectively removing portions of the ILD 130 prior to masking the device 10 for forming the source/drain contacts 120, then filling the removed portions with a dielectric material having etch selectivity that is different from the ILD 130. As such, when the portions of the ILD 130 exposed by the mask for forming the source/drain contacts 120 are removed, the source/drain contact isolation features 150 remain substantially intact due to having different etch selectivity than the ILD 130.

Figure 14A:
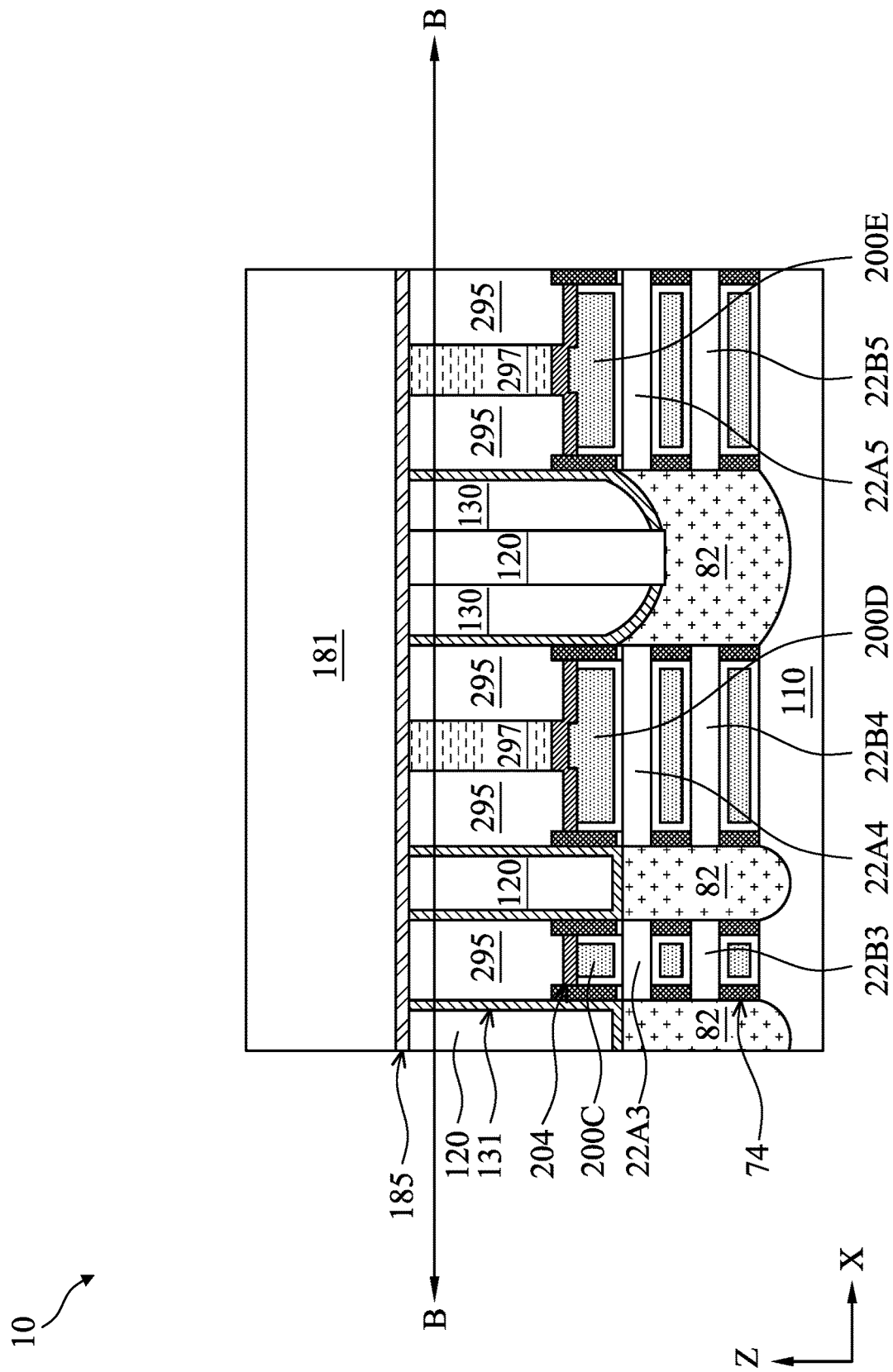
Figure 14B:
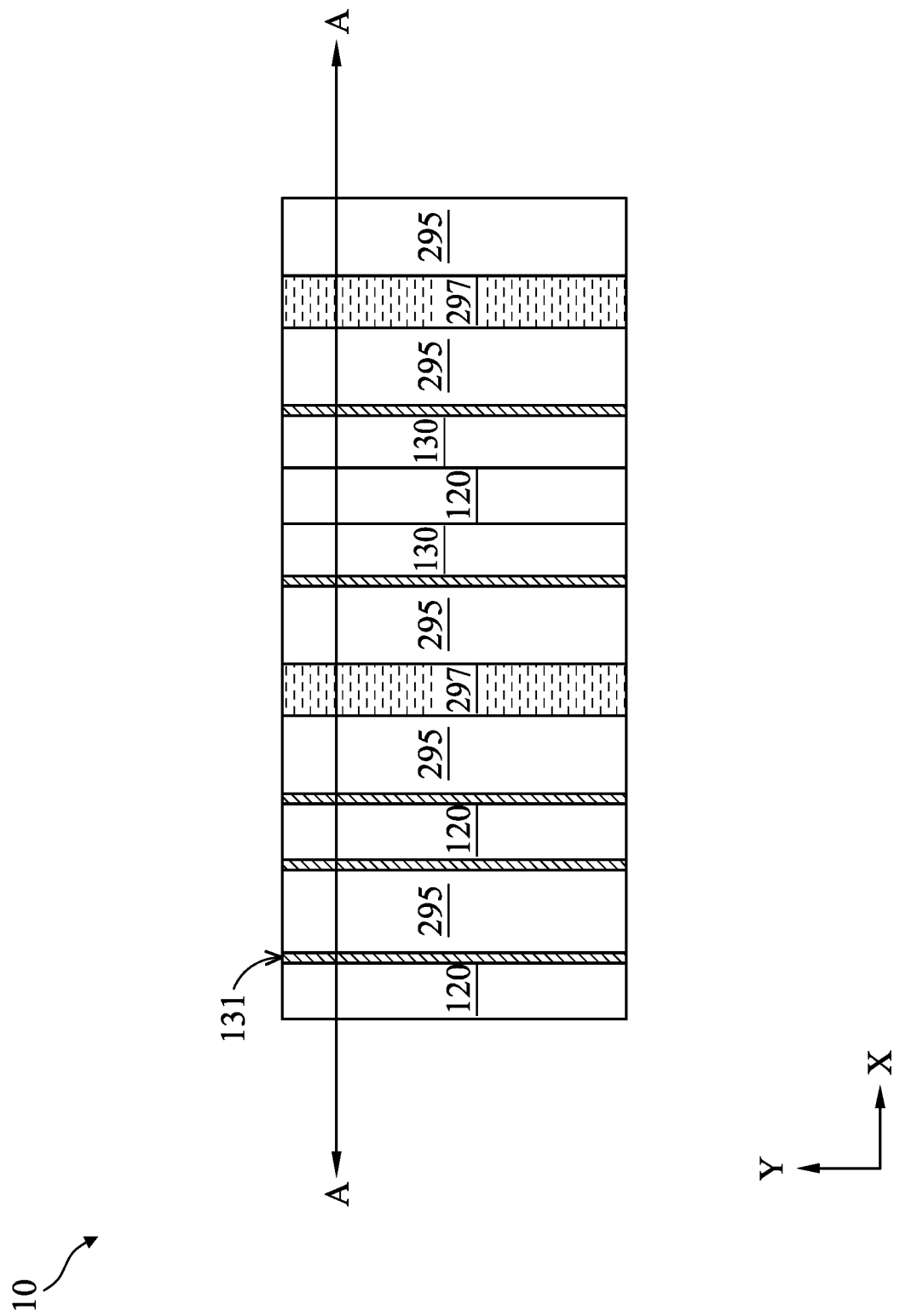

In FIGS. 14A-14B, the etch stop layer 185 and the second ILD 181 are formed following formation of the source/drain contacts 120, corresponding to act 2100 of FIG. 24. The etch stop layer 185 may be formed by a blanket deposition process that forms the etch stop layer 185 to a substantially uniform thickness (e.g., about 3 nm to about 20 nm) over the device 10. In some embodiments, the etch stop layer 185 is in contact with and covers one or more of the source/drain contacts 120, the etch stop layer 131, the capping layer 295, the ILD 130, and the support structures. Following formation of the etch stop layer 185, the second ILD 181 is formed of a dielectric material having different etch selectivity than the etch stop layer 185. As described above, the etch stop layer 185 and the second ILD 181 may be formed of different materials of LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO or the like. The second ILD 181 may be formed by a second blanket deposition process that forms the second ILD 181 covering the etch stop layer 185 to a substantially uniform thickness (e.g., about 3 nm to about 40 nm). The second ILD 181 is generally in direct contact with the etch stop layer 185.

FIGS. 15A-21B illustrate formation of the gate via 184 and the source/drain via 183 through the second ILD 181, the etch stop layer 185 and the capping layer 295 (in the case of the gate via 184), corresponding to acts 1600, 1700 of FIG. 23. Act 1600 of FIG. 23 is described in greater detail with respect to the method 2000 of FIG. 24. In FIGS. 15A-21B, the gate via 184 is formed preceding formation of the source/drain via 183. In some embodiments, the source/drain via 183 may be formed preceding formation of the gate via 184. Generally, the gate via 184 and the source/drain via 183 are formed in different processes at different times due to different materials being used to form the gate via 184 and the source/drain via 183.

Figure 19A:
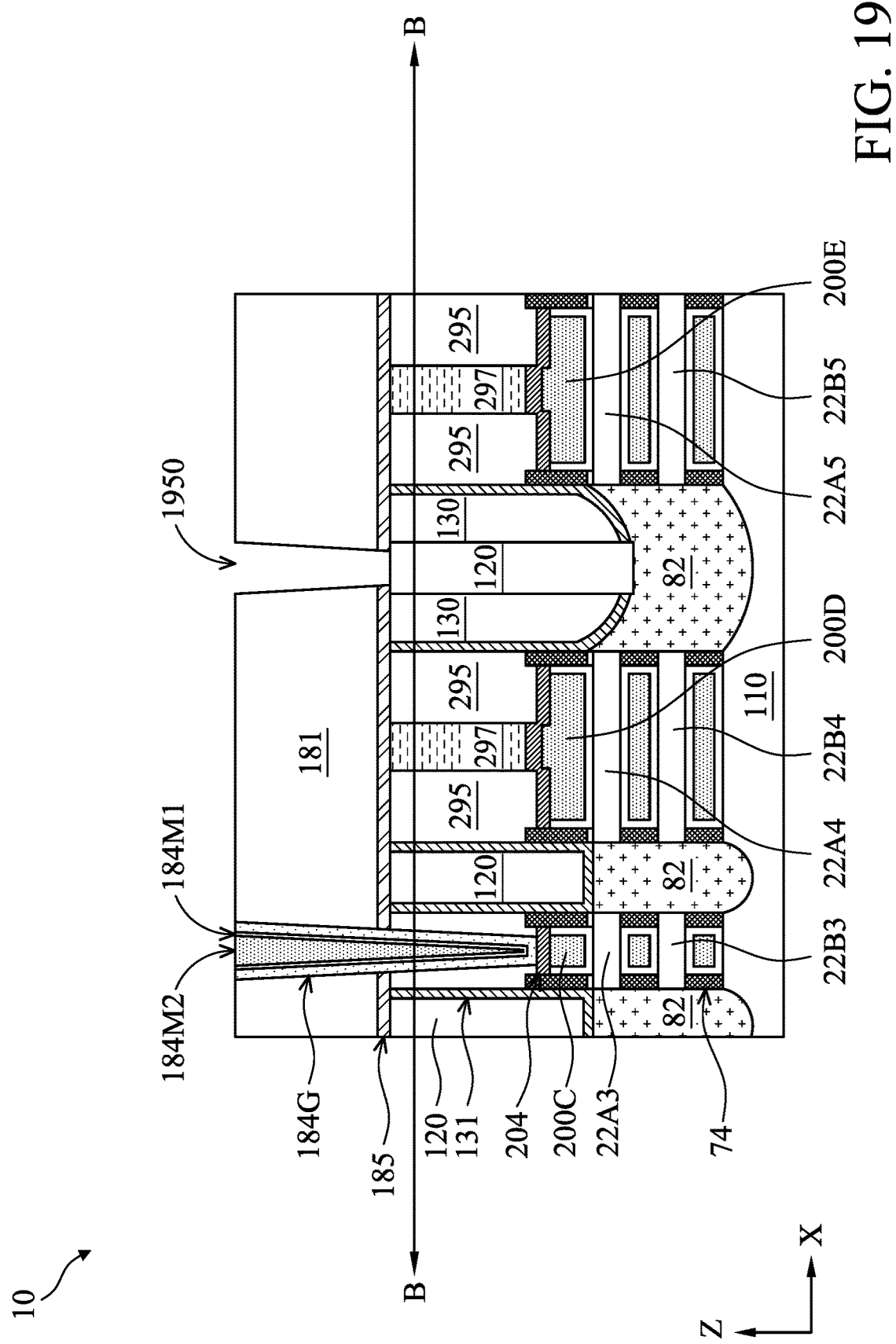
Figure 19B:
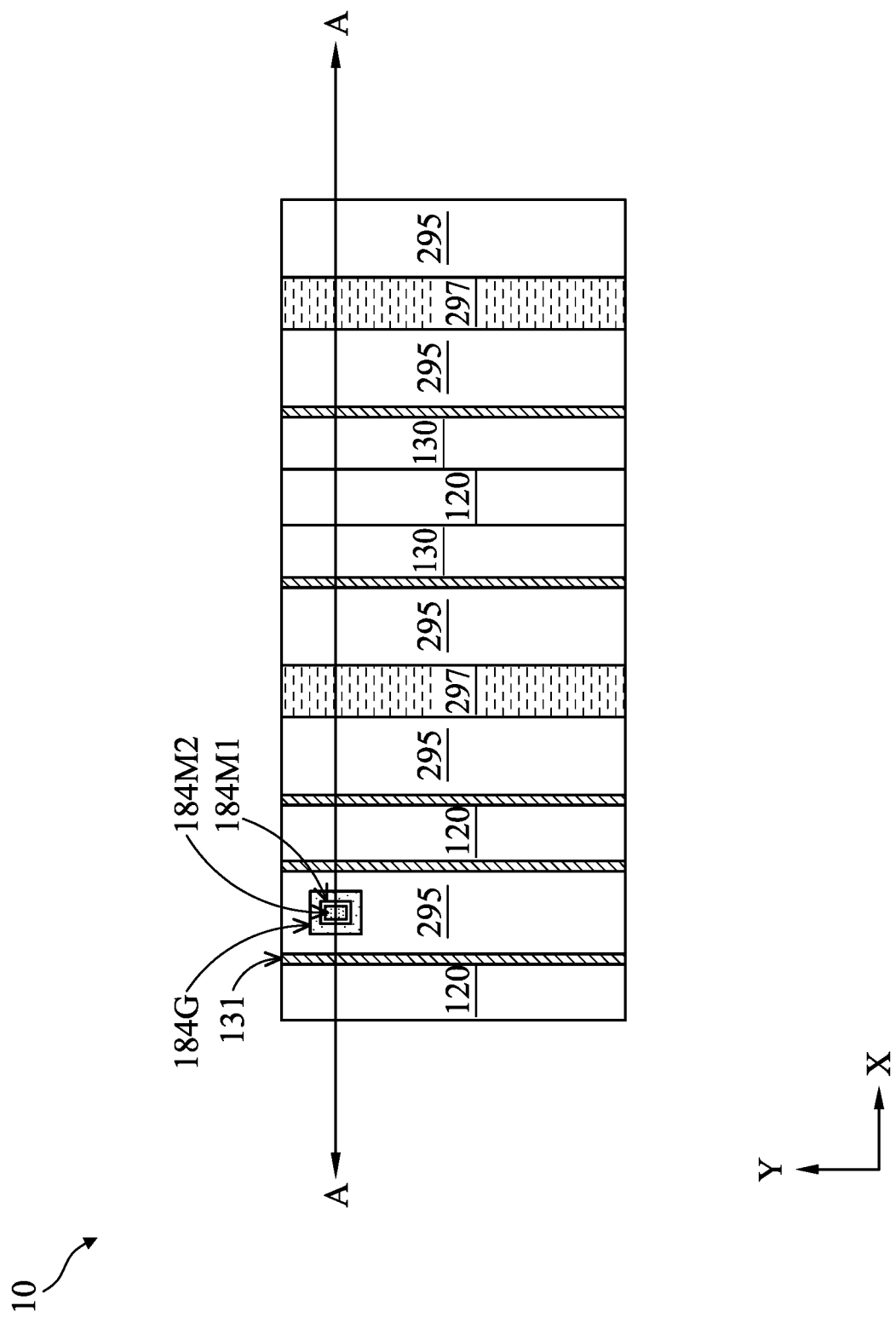

In the configuration shown in FIGS. 19A, 19B, the gate via 184 includes at least three layers: the glue layer 184G, the metal liner layer 184M1 and the metal fill layer 184M2. Use of the three layers described may increase quality of the gate via 184 (e.g., substantially no voids present) while maintaining acceptable electrical performance, such as conductivity. In some embodiments, conductivity performance of the gate via 184 is not as stringent a consideration compared to the source/drain via 183. Additionally, the gate via 184 generally has a higher aspect ratio than the source/drain via 183. As such, improved gap fill performance of the gate via 184 may be traded off against slightly reduced conductivity and contact resistance of the gate via 184, as is described in the following.

Figure 21B:
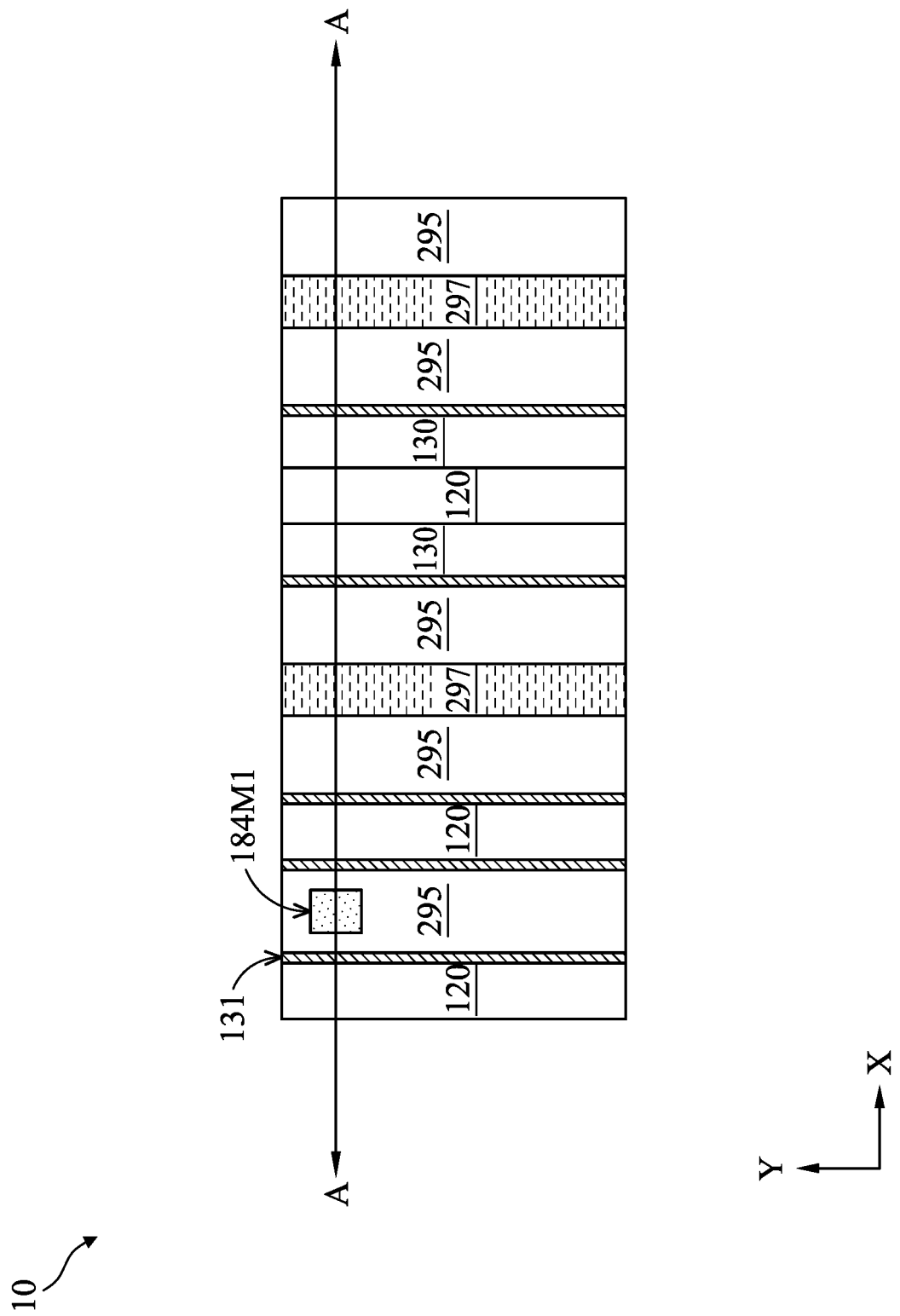

In the gate via 184, the metal liner layer 184M1 is a high-conductivity layer that generally has the highest conductivity of the three layers, but may not exhibit the best flowability/gap fill performance. In configurations in which high conductivity is desirable, thickness of the metal liner layer 184M1 may be in a range that provides high conductivity while avoiding merger of the upper portions of the metal liner layer 184M1 during deposition due to lesser flowability/gap fill performance. In some embodiments, the metal liner layer 184M1, in addition to high conductivity and lesser flowability/gap fill performance, may further exhibit low adhesion at interfaces with one or more of the second ILD 181, the ESL 185 and the capping layer 295. The glue layer 184G is or comprises a material that exhibits good adhesion with the materials of the second ILD 181, the ESL 185, the capping layer 295, and the conductive layer 204, as well as good adhesion with the material of the metal liner layer 184M1. In embodiments in which the metal liner layer 184M1 has sufficient adhesion with the materials of the second ILD 181, the ESL 185, the capping layer 295, and the conductive layer 204, the glue layer 184G may not be present, as illustrated in FIGS. 21A, 21B. Good adhesion prevents peeling of the gate via 184 from the surrounding structure. The metal fill layer 184M2 has higher flowability/gap fill performance than the metal liner layer 184M1, such that the space remaining after forming the metal liner layer 184M1 may be filled completely (e.g., substantially free of voids) by the metal fill layer 184M2. It may be desirable to form the metal fill layer 184M2 to a thickness in a range in which conductivity of the gate via 184 is high (thinner metal fill layer 184M2) while formation of voids during deposition thereof is substantially eliminated (thicker metal fill layer 184M2).

Figure 15A:
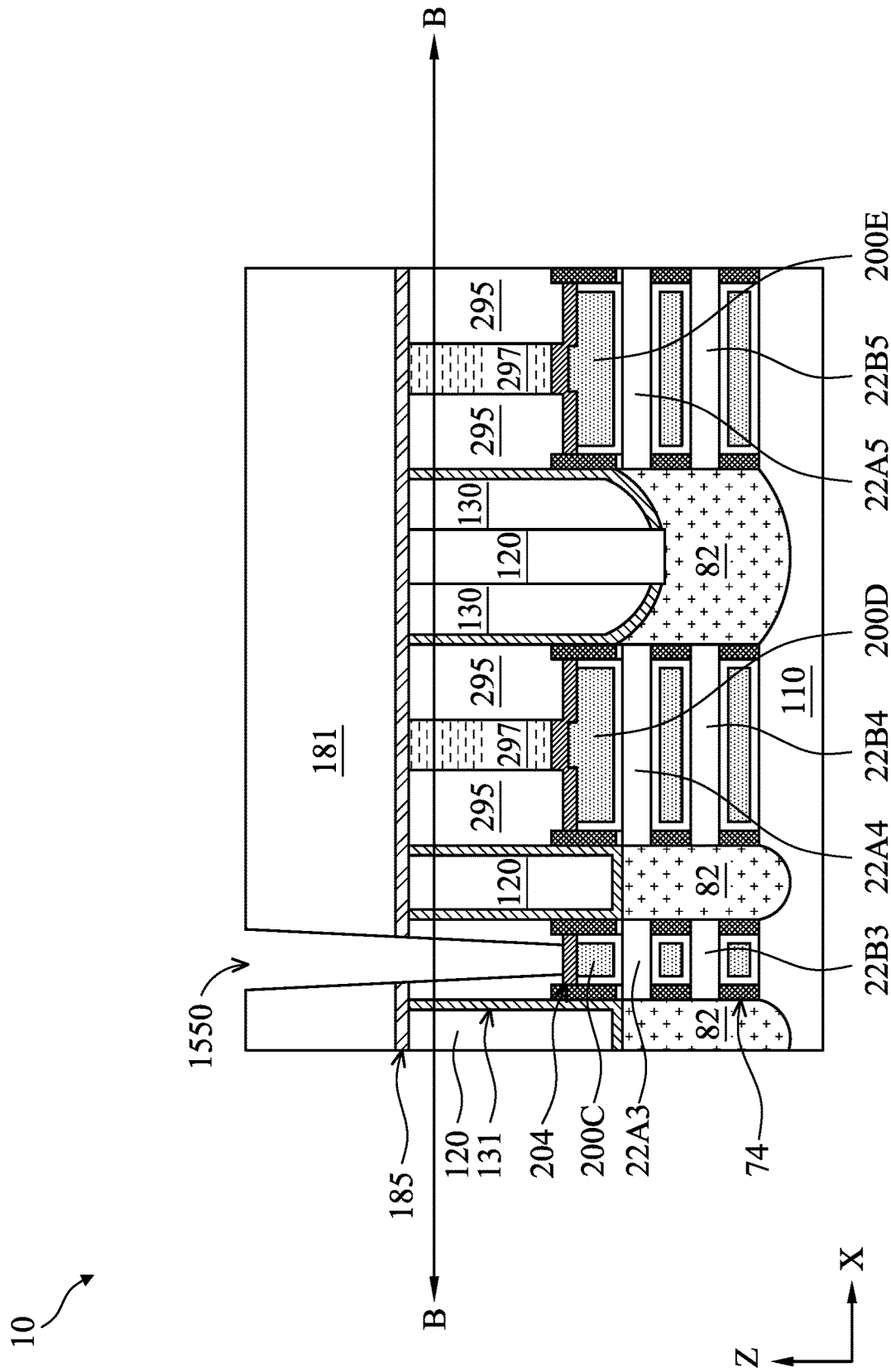
Figure 15B:
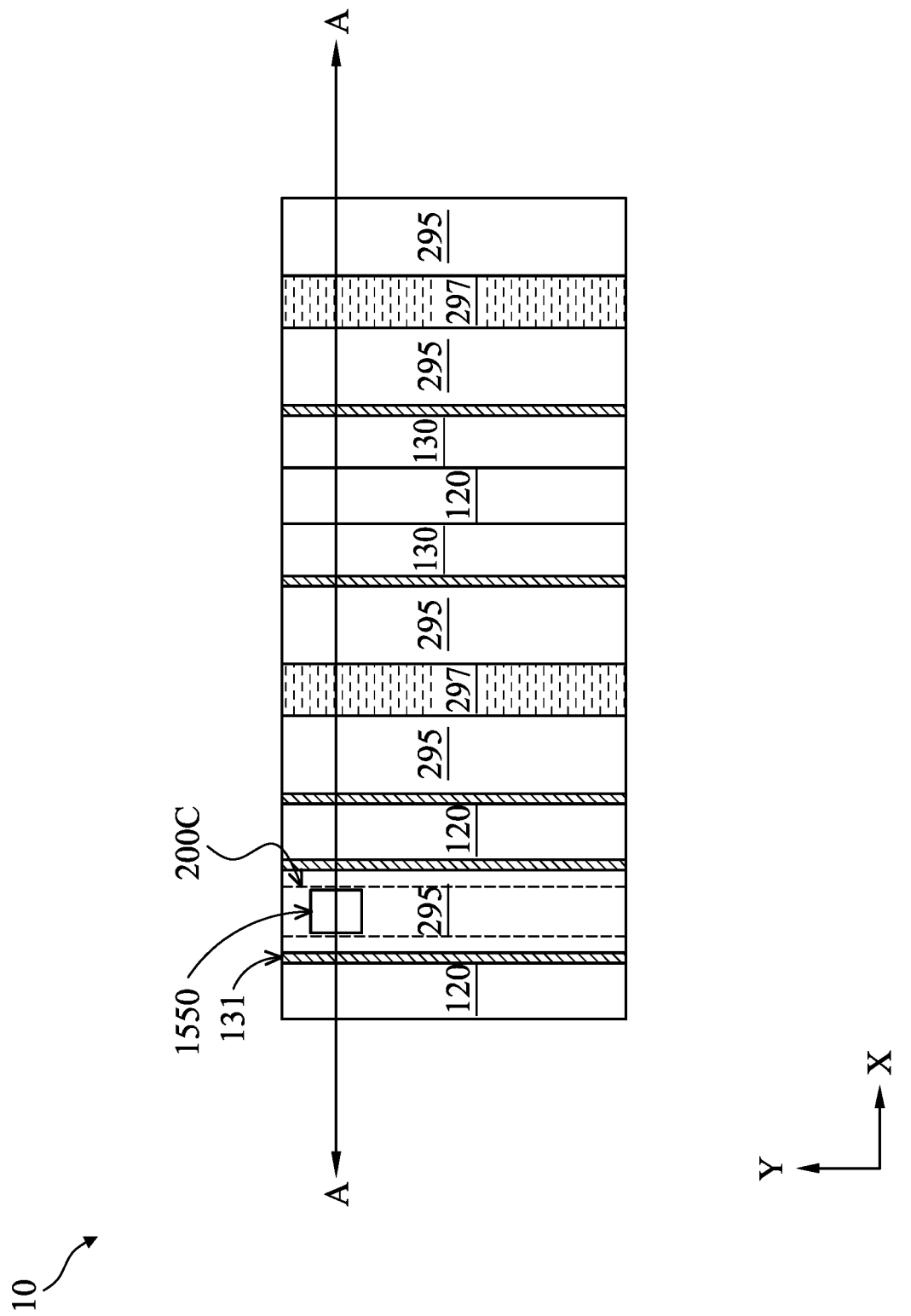

In FIGS. 15A and 15B, following formation of the ESL 185 and the second ILD 181, an opening 1550 is formed through the second ILD 181, the ESL 185 and the capping layer 295 to expose the conductive layer 204 over the gate structure 200C, corresponding to act 2200 of FIG. 24. In some embodiments, the opening 1550 exposes the fill layer 290 of the gate structure 200C when the conductive layer 204 is not present. In some embodiments, the opening 1550 is formed by one or more etching processes following a masking operation that exposes a portion of the second ILD 181 overlying the gate structure 200C (shown in phantom in FIG. 15B). A first etching process may be performed to remove exposed material of the second ILD 181 up to the ESL 185. The opening 1550 may then be deepened by breaking through the ESL 185 by a second etching process. The conductive layer 204 may then be exposed by deepening the opening 1550 through a third etching process selective to the capping layer 295. Following the first, second and third etching processes, the opening 1550 may land on the conductive layer 204 and have tapered sidewalls, as shown in FIG. 15A. In some embodiments, the opening 1550 may have substantially vertical sidewalls. Following formation of the opening 1550, the mask may be removed, for example, by an ashing process followed by a cleaning operation.

Figure 16A:
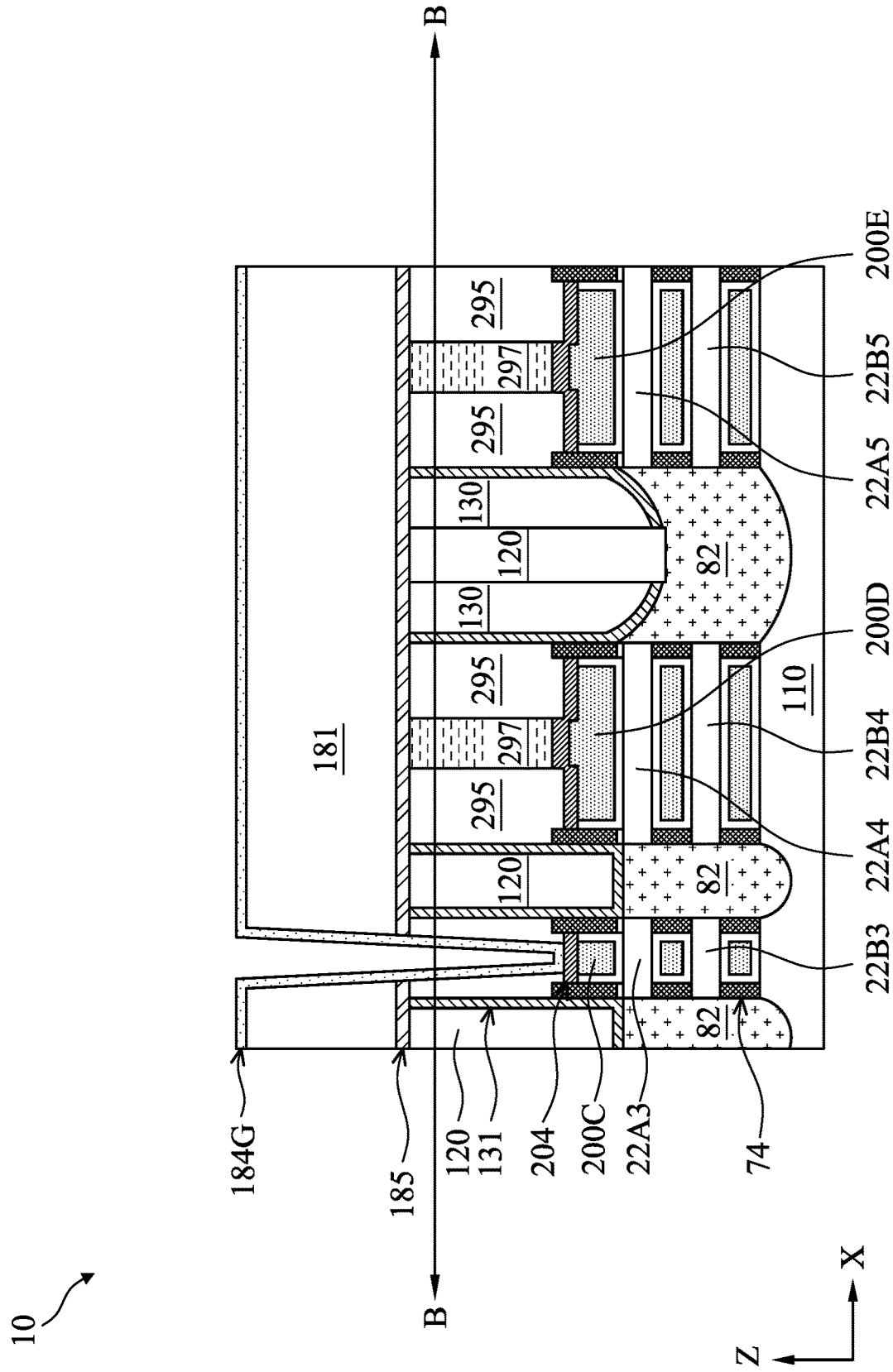
Figure 16B:
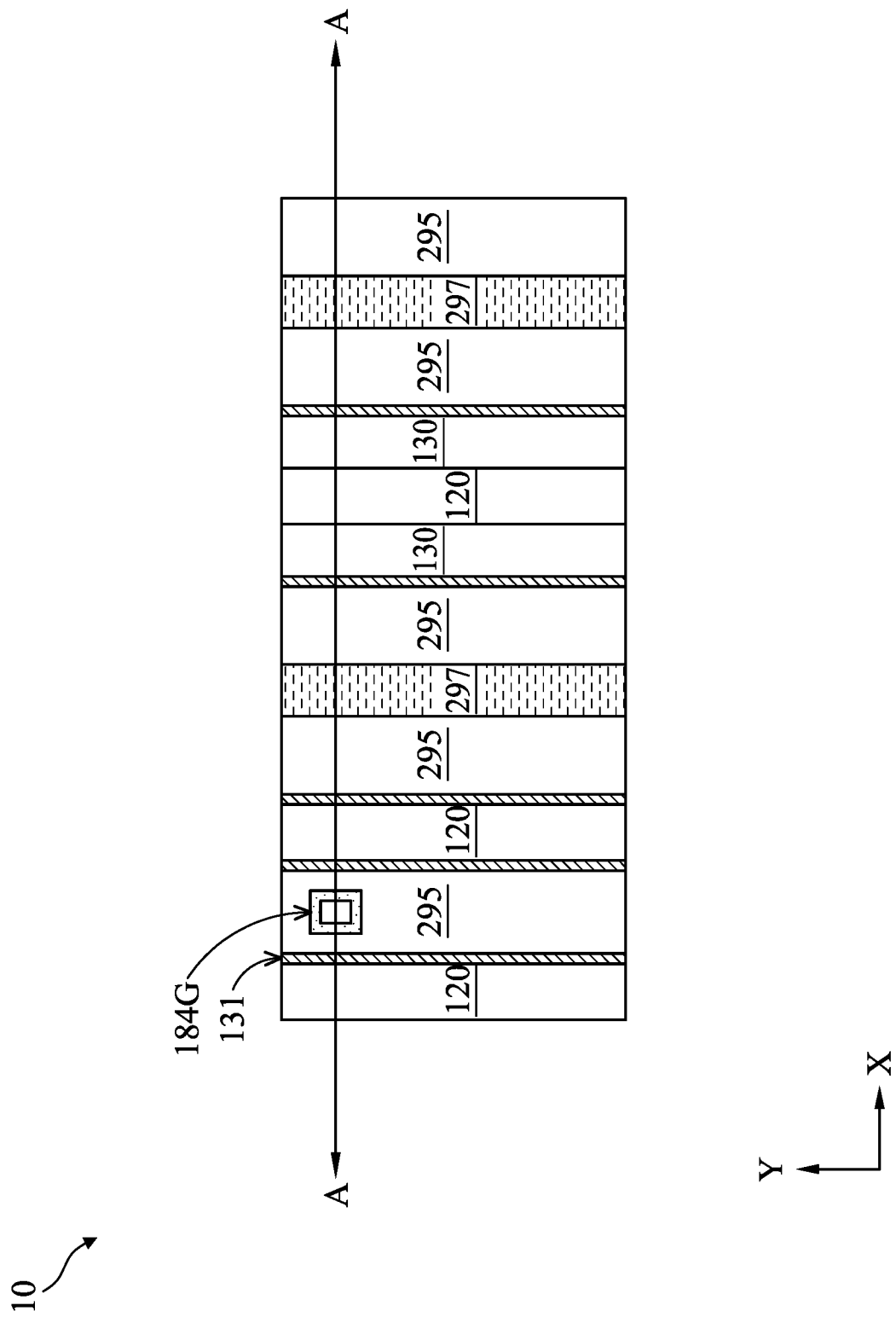

FIGS. 16A and 16B illustrate formation of the optional glue layer 184G, corresponding to act 2300 of FIG. 24. As described above, the glue layer 184G may be or include one or more materials of TiN, TaN, Ru, or other suitable material (e.g., material that adheres well to the second ILD 181, the ESL 185, the capping layer 295, the conductive layer 204 and the metal liner layer 184M1). Formation of the glue layer 184G may include blanket deposition of the material(s), which partially fills the opening 1550 by forming a thin layer (e.g., about 5 Angstroms to about 50 Angstroms) of the material(s) on the conductive layer 204 and sidewalls of the capping layer 295, the ESL 185 and the second ILD 181. Excess material of the glue layer 184G may be deposited on the upper surface of the second ILD 181, as shown. The deposition of the glue layer 184G may include one or more of a CVD, ALD, or other suitable process. Thickness of the glue layer 184G below about 5 Angstroms may lead to insufficient uniformity of the glue layer 184G, such as voids. The presence of voids in the glue layer 184G may lead to interfaces between the metal liner layer 184M1 and one or more of the second ILD 181, the ESL 185, the capping layer 295, and the conductive layer 204. Such interfaces increase risk of peeling of the gate via 184, which could lead to failure of the device 10. Above about 50 Angstroms, insufficient gap due to, for example, excessive aspect ratio may impair ability to form the metal fill layer 184M2 substantially free of voids.

Figure 17A:
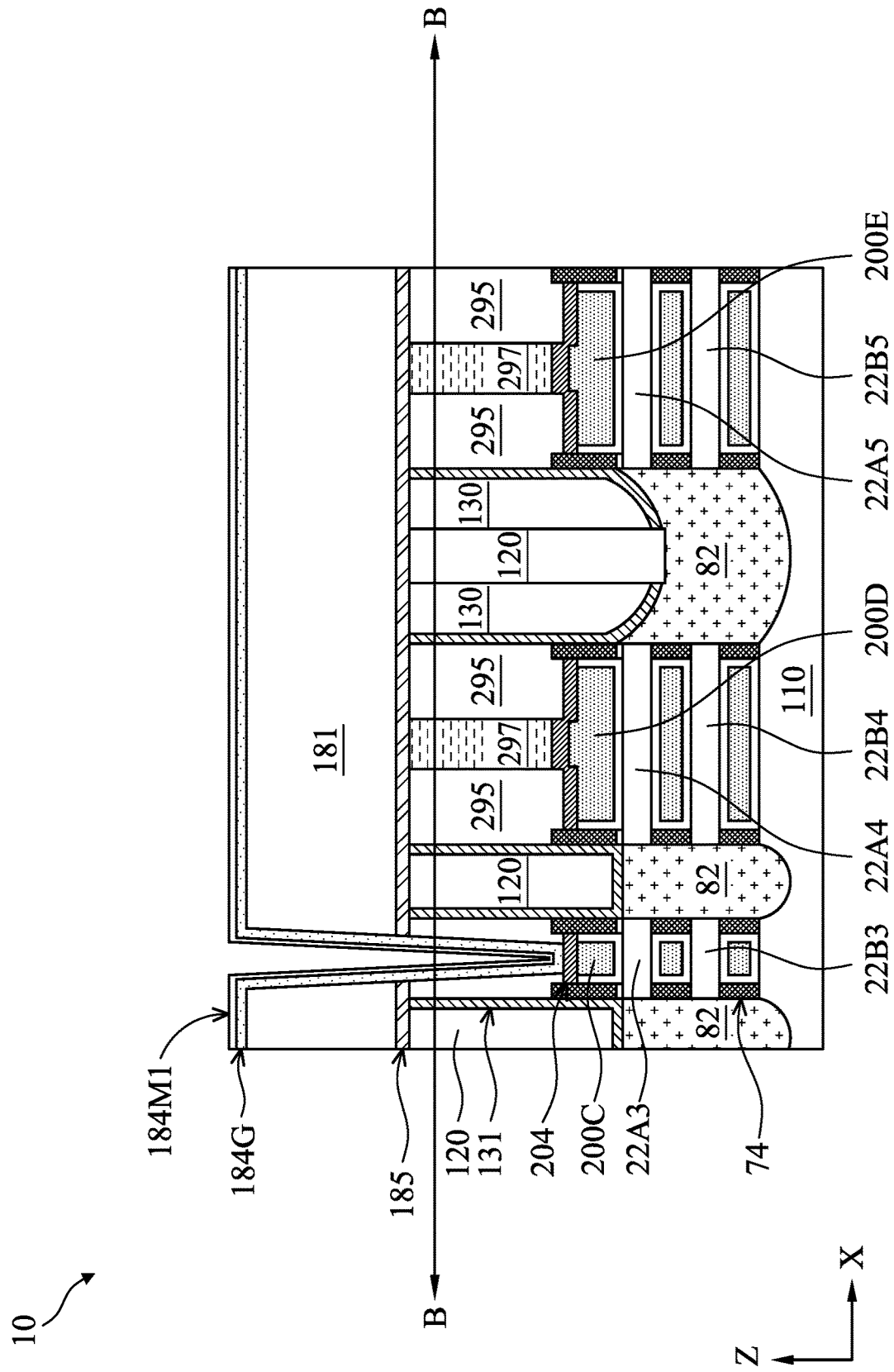
Figure 17B:
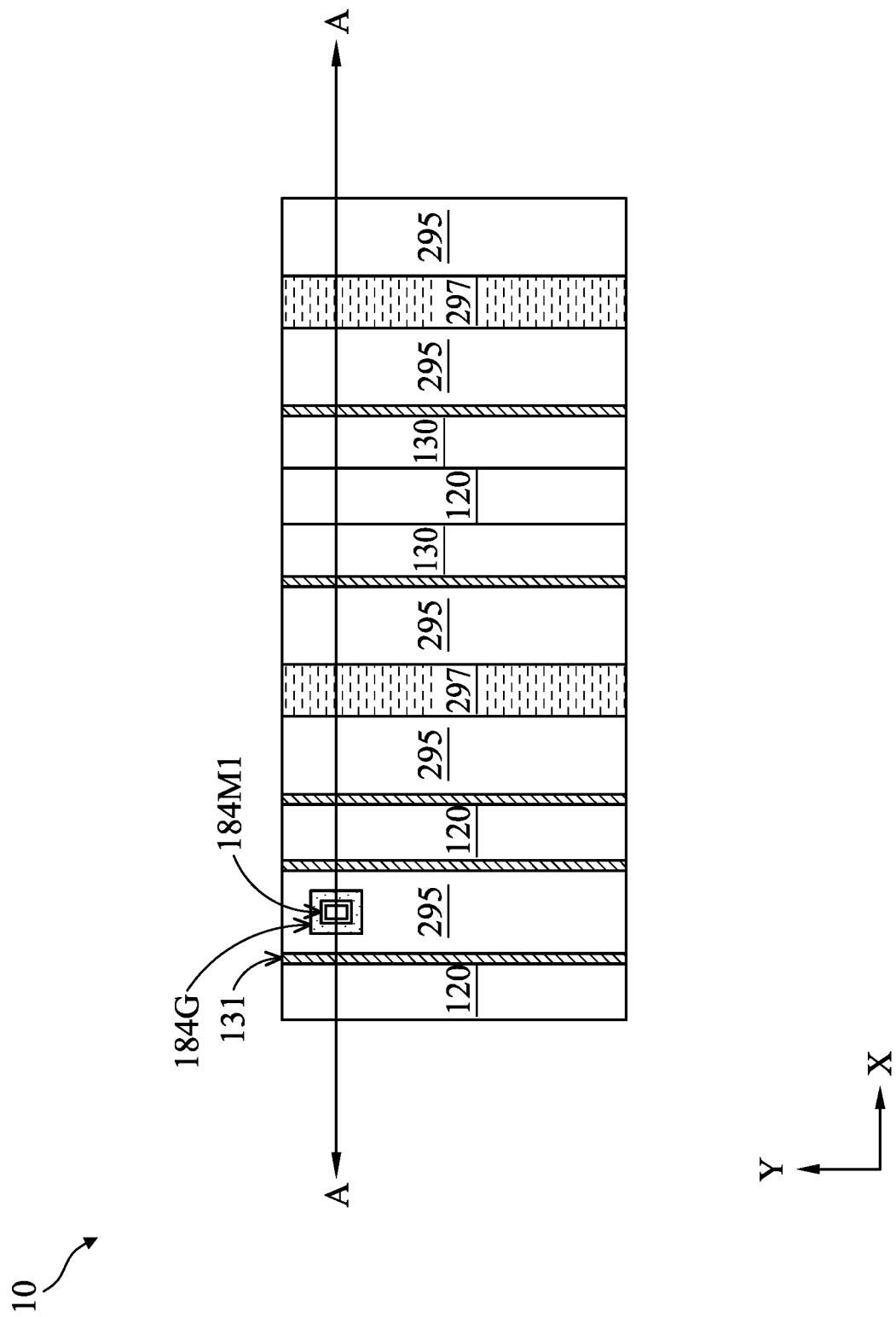

In FIGS. 17A, 17B, the metal liner layer 184M1 is formed on the glue layer 184G, corresponding to act 2400 of FIG. 24. As described above, the metal liner layer 184M1 may be or include one or more materials of W, Ru, Al, Mo, Ti, TiN, Cu, Co, alloys thereof, or the like. Formation of the metal liner layer 184M1 may include blanket deposition of the material(s), which further partially fills the opening 1550 by forming a thin layer (e.g., about 2 nm to about 20 nm) of the material(s) on the glue layer 184G. Excess material of the metal liner layer 184M1 may be deposited on the upper surface of glue layer 184G overlying the second ILD 181, as shown. The deposition of the metal liner layer 184M1 may include one or more of a CVD, ALD or other suitable process. Generally, the material(s) of the metal liner layer 184M1 have higher conductivity than the material(s) of the glue layer 184G and the metal fill layer 184M2. Thickness below 2 nm in the metal liner layer 184M1 may lead to insufficient conductivity of the gate via 184. Above 20 nm, the thickness of the metal liner layer 184M1 may be excessive to the point that the metal fill layer 184M2 cannot be formed substantially free of voids.

Figure 18A:
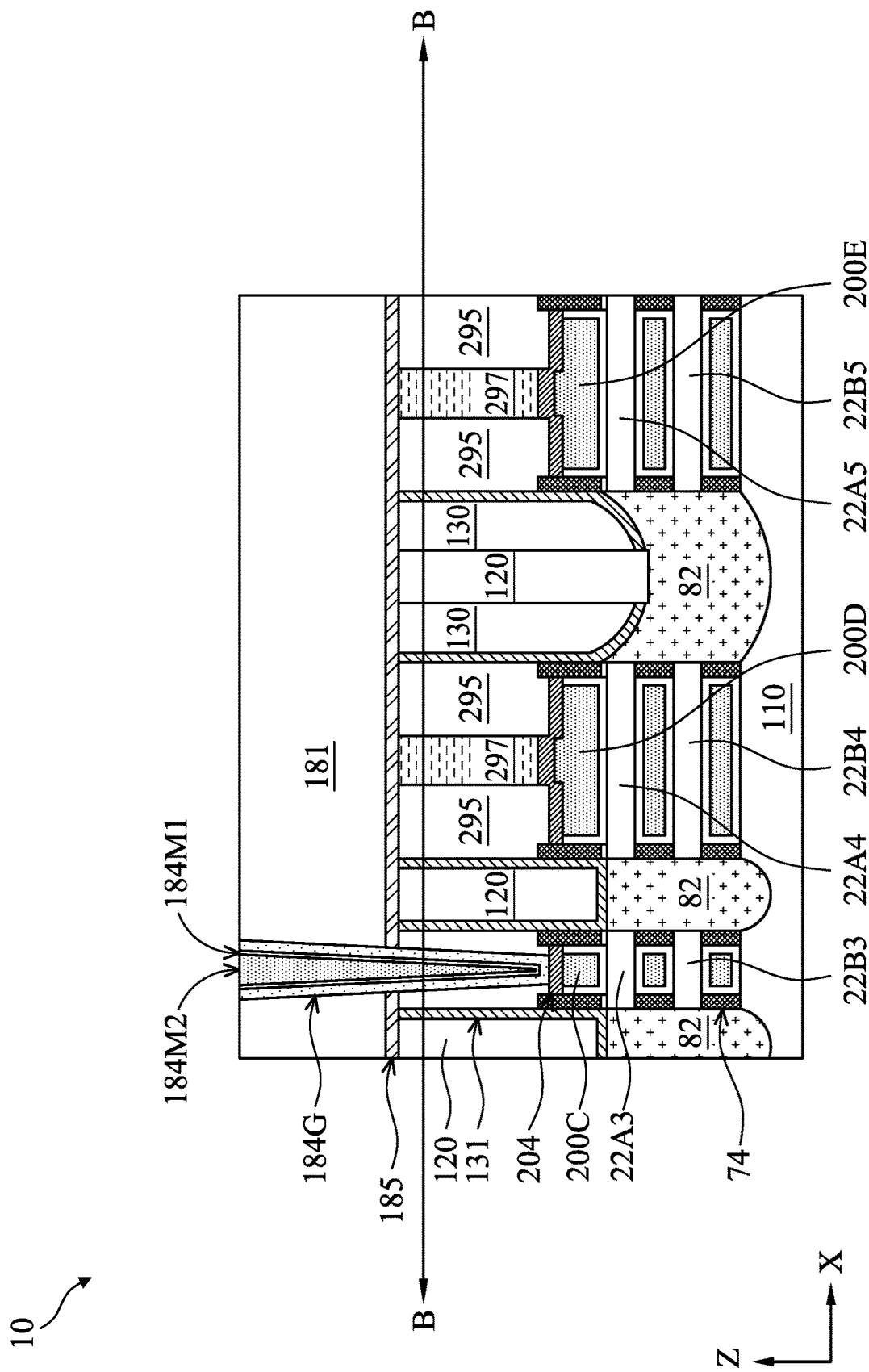
Figure 18B:
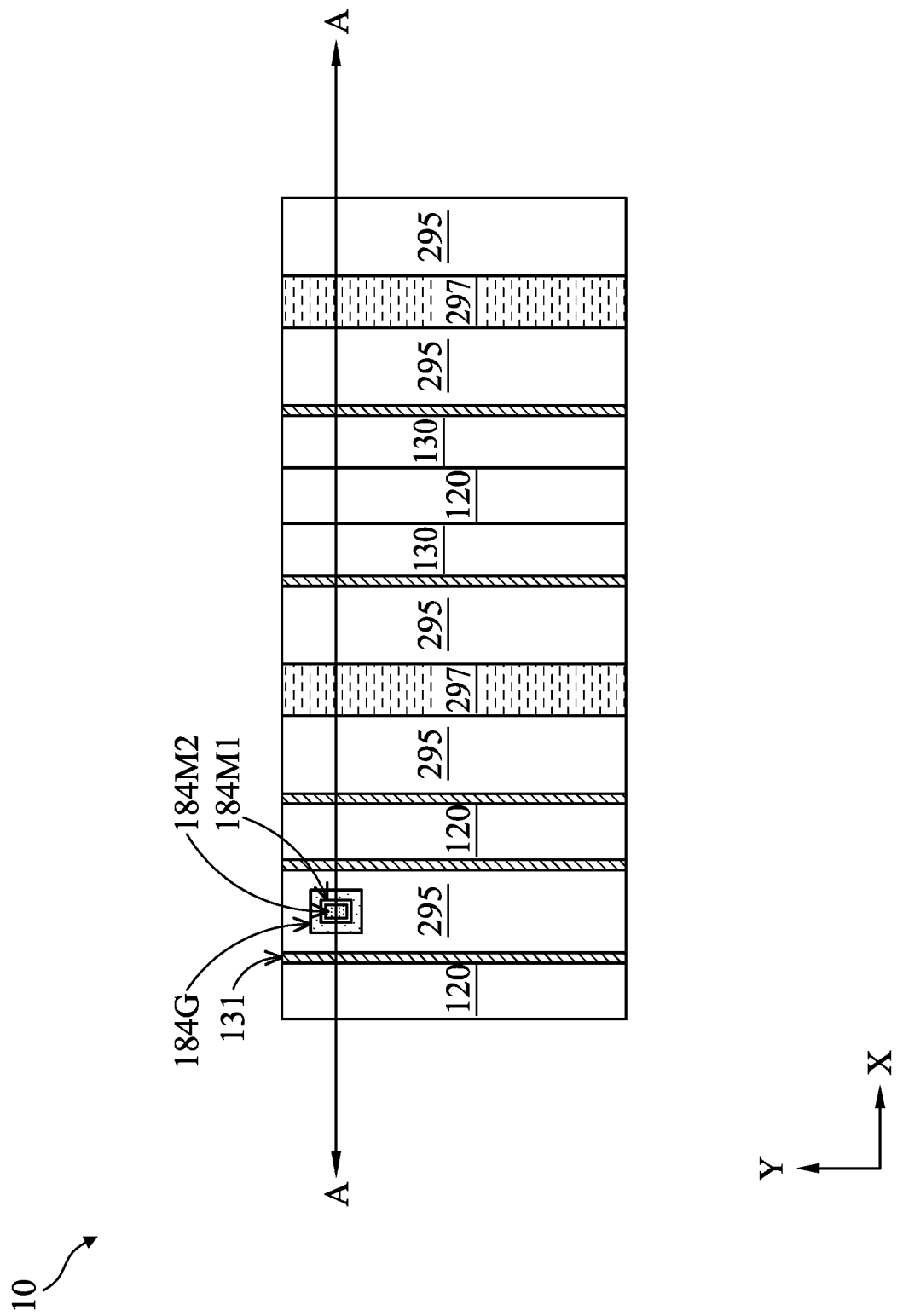

In FIGS. 18A, 18B, the metal fill layer 184M2 is formed on the metal liner layer 184M1, corresponding to act 2500 of FIG. 24. As described above, the metal fill layer 184M2 may be or include one or more materials of W, Ru, Al, Mo, Ti, TiN, Cu, Co, alloys thereof, or the like. The metal fill layer 184M2 is or comprises a different composition of material(s) (e.g., constituent elements, ratio of elements) than the metal liner layer 184M1. Generally, the metal fill layer 184M2 has better flowability/gap fill performance than the metal liner layer 184M1, and lower conductivity than the metal liner layer 184M1. Conductivity of the metal fill layer 184M2 may be similar to or greater than conductivity of the glue layer 184G. Formation of the metal fill layer 184M2 may include blanket deposition of the material(s), which completes filling of the opening 1550 by forming a filling layer (e.g., about 5 nm to about 40 nm upper dimension) of the material(s) on the metal liner layer 184M1. The deposition of the metal fill layer 184M2 may include one or more of a CVD, ALD or other suitable process. Below about 5 nm for the upper dimension (e.g., width in the X-axis direction) of the metal fill layer 184M2, voids may be present in the metal fill layer 184M2, for example, due to high aspect ratio of the portion of the opening 1550 remaining following deposition of the glue layer 184G and the metal liner layer 184M1. Above about 40 nm, the metal fill layer 184M2 may occupy a large enough volume of the gate via 184 that conductivity of the gate via 184 is insufficient.

Excess material of the metal fill layer 184M2 may be deposited on the upper surface of metal liner layer 184M1 overlying the second ILD 181. Following deposition of the metal fill layer 184M2, as shown in FIG. 18A, the excess materials of the metal fill layer 184M2, the metal liner layer 184M1 and the glue layer 184G may be removed, for example, by a CMP operation, corresponding to operation 2600 of FIG. 24. In some embodiments, the CMP operation stops on the second ILD 181. In some embodiments, the CMP operation continues for a short period after reaching the second ILD 181, such that height of the gate via 184 and the second ILD 181 are reduced following the CMP operation. Generally, following the CMP operation, the upper surfaces of the gate via 184 and the second ILD 181 are substantially coplanar.

FIGS. 19A-20B illustrate formation of the source/drain via 183 on the source/drain contact 120, corresponding to act 1700 of FIG. 23. In FIGS. 19A, 19B, following completion of the gate via 184, including deposition of the glue layer 184G, the metal liner layer 184M1 and the metal fill layer 184M2, and removal of the excess material(s) overlying the second ILD 181, an opening 1950 for forming the source/drain via 183 is made in the second ILD 181 and the etch stop layer 185. In some embodiments, one or more masking layers are formed over the second ILD 181 and the gate via 184. The masking layer(s) may include photoresist layers, hard mask layers, anti-reflective coating layers, and/or other suitable material layers. The masking layer(s) are patterned to expose the portion of the second ILD 181 in which the opening 1950 is formed in subsequent operations. In some embodiments, the opening 1950 is formed in the second ILD 181 by one or more etching operations, such as one or more atomic layer etching (ALE) cycles. Following formation of the opening 1950 in the second ILD 181, the opening 1950 is expanded downward by breaking through the ESL 185, which may include one or more ALE cycles using a different etchant than used for etching the second ILD 181. Following expansion of the opening 1950 through the ESL 185, an upper surface of the source/drain contact 120 is exposed through the opening 1950. As shown in FIG. 19A, following formation of the opening 1950 exposing the source/drain contact 120, the opening 1950 may have tapered sidewalls. In some embodiments, the sidewalls of the opening 1950 are substantially vertical.

Figure 20A:
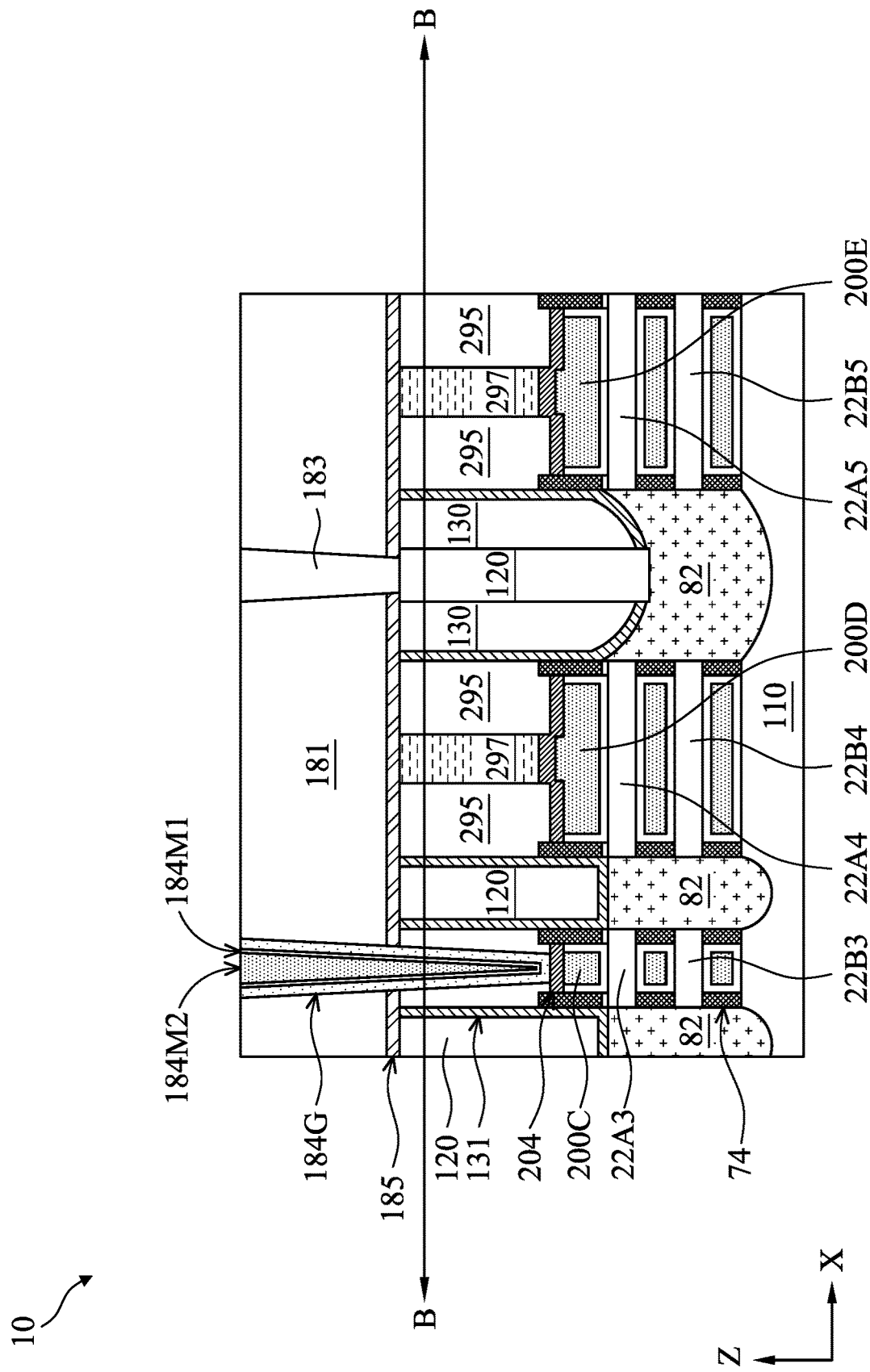
Figure 20B:
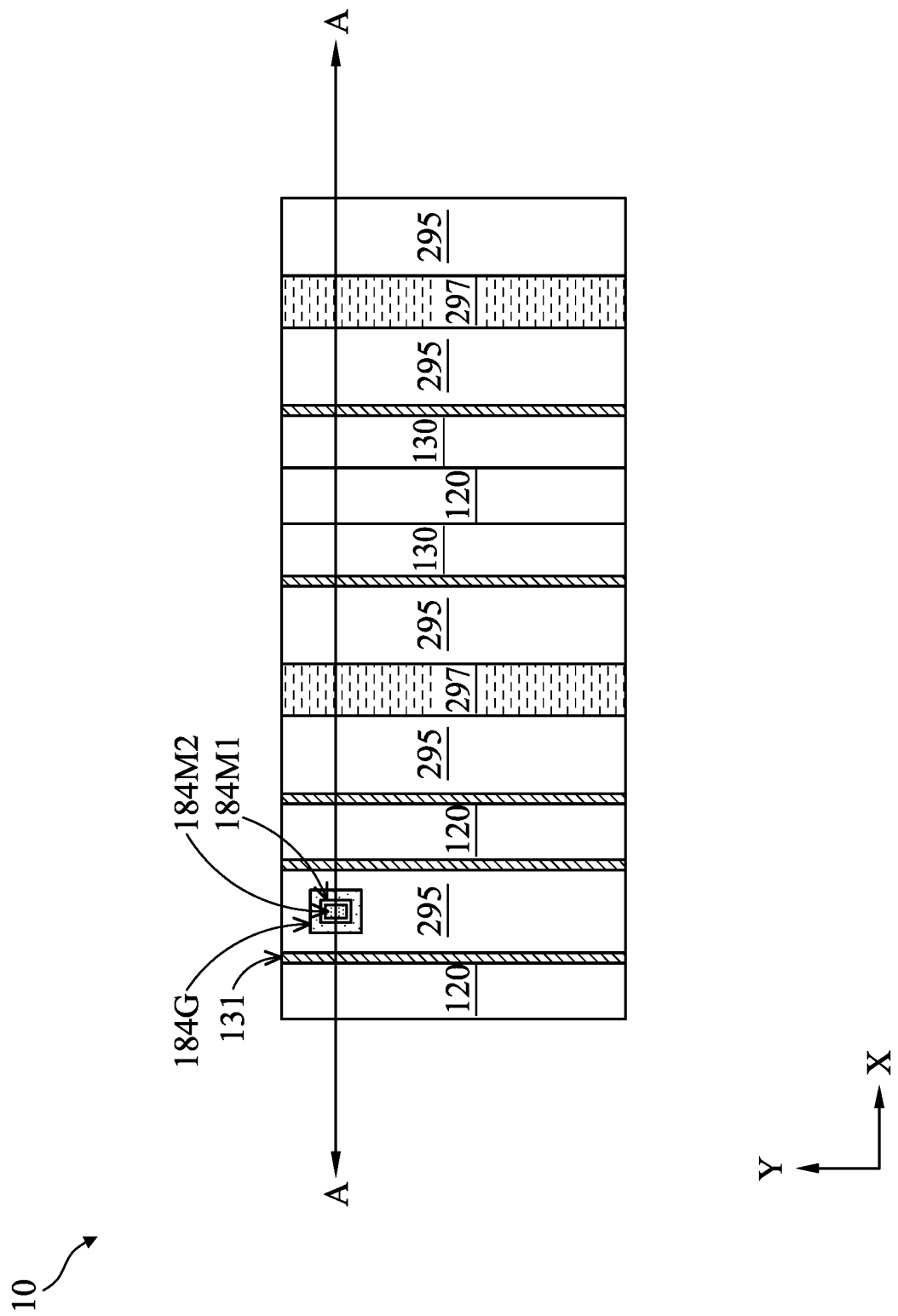

In FIGS. 20A, 20B, following formation of the opening 1950 exposing the source/drain contact 120, the source/drain via 183 is formed by filling the opening 1950 with material of the source/drain via 183, which is substantially the same as material of the source/drain contact 120. In some embodiments, the material of the source/drain via 183 is or includes one or more of W, Ru, Mo, Co, Cu, alloys thereof or the like. The source/drain via 183 may be formed by depositing the material using a suitable process, such as one or more of CVD, ALD, or the like. The layer of the material deposited when forming the source/drain via 183 may be referred to as a "second metal fill layer." By forming the source/drain via 183 of the same material as the source/drain contact 120, conductivity of the source/drain via 183 may be high, which improves device performance. Choice of material for the source/drain via 183 may be more flexible due to the lower aspect ratio of the opening 1950 compared to the opening 1550 used when forming the gate via 184.

FIGS. 21A, 21B show the gate via 184 in accordance with other embodiments of the disclosure. As described above, the metal liner layer 184M1 may be or include material(s) that exhibit sufficient adhesion to the second ILD 181, the ESL 185, the capping layer 295 and the conductive layer 204 to avoid peeling of the gate via 184 from the surrounding structure. As such, in some embodiments, the glue layer 184G is not present, as shown in FIG. 21A, and the gate via 184 includes the metal liner layer 184M1 and the metal fill layer 184M2. Profile of the metal liner layer 184M1 may exhibit a "bottom up" shape different from the "conformal liner" shape illustrated in FIG. 17A and FIG. 18A. In FIG. 21A, the metal liner layer 184M1 may be deposited such that thickness of the metal liner layer 184M1 at the bottom of the opening 1950 is in a range of about 5 nm to about 50 nm, and thickness of the metal liner layer 184M1 at upper sidewalls of the opening 1950 is in a range of about 1 nm to about 10 nm. Generally, the metal liner layer 184M1 has bottom thickness that is greater than sidewall thickness, as shown. The metal liner layer 184M1 may be deposited by CVD, ALD, or another suitable deposition process. The metal liner layer 184M1 may be in direct contact with sidewalls of the second ILD 181, the ESL 185 and the capping layer 295, and the upper surface of the conductive layer 204.

Further to FIG. 21A, following deposition of the metal liner layer 184M1, the metal fill layer 184M2 is formed over the metal liner layer 184M1 of a material different from the metal liner layer 184M1. Width of the metal fill layer 184M2 at the upper surface of the gate via 184 may be in a range of about 5 nm to about 40 nm. The metal fill layer 184M2 may be formed by a suitable deposition process, such as CVD, ALD, or the like. Following formation of the metal fill layer 184M2, excess material of the metal liner layer 184M1 and the metal fill layer 184M2 overlying the second ILD 181 may be removed by a suitable removal process, such as an etch, a CMP, or the like. In some embodiments, the upper surface of the metal fill layer 184M2 is coplanar with the upper surfaces of the second ILD 181 and the source/drain via 183. The lower surface of the metal fill layer 184M2 may be above the lower surface of the second ILD 181, as shown in FIG. 21A. In some embodiments, depending on thickness of the metal liner layer 184M1, the metal fill layer 184M2 may extend to a level below the lower surface of the second ILD 181 or below the lower surface of the ESL 185. By filling the opening 1550 with a greater volume of the metal liner layer 184M1, conductivity of the gate via 184 may be increased.

Additional processing may be performed to finish fabrication of the GAA devices 20A-20E. For example, an interconnect structure may be formed over the gate via 184 and the source/drain via 183. The interconnect structure may include a plurality of dielectric layers surrounding metallic features, including conductive traces and conductive vias, which form electrical connection between devices on the substrate 110, such as the GAA devices 20A-20E, as well as to IC devices external to the IC device 10.

FIGS. 22A-22C show formation of a third ILD 2281, an ESL 2285, a second gate via 2284 and a second source/drain via 2283 overlying the second ILD 181, the gate via 184 and the source/drain via 183.

In FIG. 22A, the ESL 2285 may be deposited over the second ILD 181, the gate via 184 and the source/drain via 183. Following formation of the ESL 2285, the third ILD 2281 is formed over the ESL 2285, for example, by a blanket deposition process. Openings 2250 are then formed in the third ILD 2281 aligned with the gate via 184 and the source/drain via 183, respectively. The openings 2250 may be extended through the ESL 2285 to expose the upper surfaces of the gate via 184 and the source/drain via 183. In some embodiments, the opening 2250 over the gate via 184 exposes one or more of the metal fill layer 184M2, the metal liner layer 184M1 and the glue layer 184G (see FIG. 20A). For example, the opening 2250 may expose at least a portion of the metal liner layer 184M1, as shown in phantom in FIGS. 20A-20C. In some embodiments, following extending of the opening 2250 through the ESL 2285, the opening 2250 exposes a portion of the metal fill layer 184M2, and remaining portions of the metal fill layer 184M2, the metal liner layer 184M1 and the glue layer 184G (when present) are in direct contact with the ESL 2285. In some embodiments, the opening 2250 over the source/drain via 183 exposes a portion of the source/drain via 183 while remaining portions of the source/drain via 183 are covered by, and in direct contact with, the ESL 2285.

In FIG. 22B, the openings 2250 are filled by depositing material(s) of the second gate via 2284 and the second source/drain via 2283 in the openings 2250. In some embodiments, the second gate via 2284 and the second source/drain via 2283 are deposited in the same process operation using the same material. In some embodiments, the material of the second gate via 2284 and the second source/drain via 2283 is the same as the material of the source/drain via 183 and the source/drain contact 120. Generally, the openings 2250 have lower aspect ratio (e.g., are easier to fill without voids) than the opening 1550. As such, choice of material for the second gate via 2284 may be more flexible than for the gate via 184. In some embodiments, the material of the second gate via 2284 may have lower flowability/gap fill performance and higher conductivity than the material of the metal fill layer 184M2. Following deposition of the material(s), the lower surface of the second gate via 2284 may be in contact with the upper surface of one or more of the metal fill layer 184M2, the metal liner layer 184M1 and the glue layer 184G. FIG. 22B illustrates the second gate via 2284 and the second source/drain via 2283 formed of the same material(s) in the same process operation. In some embodiments, the process illustrated in FIGS. 13A-21B may be repeated to form the second gate via 2284 and the second source/drain via 2283 in different operations at different times. For example, the gate via 2284 may include one or more of a glue layer, a metal liner layer and a metal fill layer, which may be similar in material and thickness to the glue layer 184G, the metal liner layer 184M1 and the metal fill layer 184M2, respectively.

In FIG. 22C, excess material following deposition of the second gate via 2284 and the second source/drain via 2283 is removed by a suitable process, such as an etch, CMP, or the like. In some embodiments, the removal process thins the third ILD 2281 and the gate and source/drain vias 2284, 2283 in the Z-axis direction. In some embodiments, height (e.g., in the Z-axis direction) of the second gate via 2284 is substantially the same as height of the second source/drain via 2283 following the removal process.

Additional processing may be performed to finish fabrication of the GAA devices 20A-20E. In some embodiments, second capping layers (not shown) are present over the source/drain contacts 120. Configurations in which only the capping layers 295 over the gate structures 200A-200E are present (e.g., no second capping layers present over the source/drain contacts 120) may be considered "single SAC" structures, and configurations in which the capping layers 295 and the second capping layers are both present may be considered "double SAC" structures. The source/drain contact isolation structures 150 with reduced aspect ratio are compatible with both single SAC and double SAC configurations.

Embodiments may provide advantages. The metal liner layer 184M1 provides good conductivity in the gate via 184, and the metal fill layer 184M2 provides good gap fill performance, such that the gate via 184 has good conductivity and is substantially free of voids. The optional glue layer 184G ensures good adhesion between the metal liner layer 184M1 and the surrounding structure, including the second ILD 181, the ESL 185, the capping layer 295 and the conductive layer 204. As such, device 10 process yield is increased while maintaining good performance.

In accordance with at least one embodiment, a device includes: a substrate; a gate structure wrapping around a vertical stack of nanostructure semiconductor channels; a source/drain abutting the vertical stack and in contact with the nanostructure semiconductor channels; and a gate via in contact with the first gate structure. The gate via includes: a metal liner layer having a first flowability; and a metal fill layer having a second flowability higher than the first flowability.

In accordance with at least one embodiment, a device includes: a substrate; a first semiconductor channel over the substrate; a gate structure over and surrounding the semiconductor channel; a second semiconductor channel over the substrate and laterally separated from the first semiconductor channel; a source/drain region abutting the second semiconductor channel; a source/drain contact over the source/drain region, formed of a first conductive material having first conductivity; a source/drain via in contact with the source/drain contact, formed of the first conductive material; and a gate via in contact with the gate structure, formed of at least one second conductive material having lower conductivity than the first conductive material.

In accordance with at least one embodiment, a method includes: forming a gate structure over and surrounding nanostructure semiconductor channels over a substrate; forming a source/drain region over and in the substrate; forming a source/drain contact in contact with the source/drain region; and forming a gate via. The forming a gate via includes: forming a first opening exposing the gate structure; forming a metal liner layer in the first opening; and forming a first metal fill layer over the metal liner layer of a different material than the metal liner layer. The method includes forming a source/drain via, including: forming a second opening exposing the source/drain contact; and forming a second metal fill layer in the second opening of a different material than the first metal fill layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
 a substrate;
 a gate structure wrapping around a vertical stack of nanostructure semiconductor channels;
 a source/drain abutting the vertical stack and in contact with the nanostructure semiconductor channels; and
 a gate via in contact with the gate structure, including:
  a metal liner layer having a first flowability; and
  a metal fill layer having a second flowability higher than the first flowability of the metal liner layer.

2. The device of claim 1, wherein the gate via further includes a glue layer, and the metal liner layer is between the glue layer and the metal fill layer.

3. The device of claim 2, wherein the glue layer is in contact with an interlayer dielectric layer, an etch stop layer, a capping layer and a conductive layer of the gate structure, the glue layer extending through the etch stop layer.

4. The device of claim 3, wherein the conductive layer overlies and is in contact with a dielectric layer of the gate structure and a conductive fill layer of the gate structure.

5. The device of claim 1, wherein the metal liner layer is in contact with an interlayer dielectric layer, an etch stop layer, a capping layer and a conductive layer of the gate structure.

6. The device of claim 5, wherein a lower surface of the metal fill layer is at a level between upper and lower surfaces of the interlayer dielectric layer.

7. A device comprising:
    a substrate;
    a first semiconductor channel over the substrate;
    a gate structure over and surrounding the first semiconductor channel;
    a second semiconductor channel over the substrate and laterally separated from the first semiconductor channel;
    a source/drain region abutting the second semiconductor channel;
    a source/drain contact over the source/drain region, formed of a first conductive material having first conductivity;
    a source/drain via in contact with the source/drain contact, formed of the first conductive material; and
    a first gate via in contact with the gate structure, formed of at least one second conductive material and at least one third conductive material, the second conductive material having lower conductivity than the first conductive material, the third conductive material having a lower flowability and a higher conductivity than the second conductive material.

8. The device of claim 7, further including an etch stop layer on the gate structure, the first gate via extending through the etch stop layer.

9. The device of claim 8, wherein the first gate via further includes a metal fill layer formed of the second conductive material and a metal liner layer formed of the third conductive material, the metal liner layer surrounding the metal fill layer.

10. The device of claim 7, further comprising:
    a second source/drain via in contact with the source/drain via, formed of a third conductive material; and
    a second gate via in contact with the first gate via, formed of the third conductive material and having substantially the same height as the second source/drain via.

11. The device of claim 10, wherein a metal fill layer of the first gate via is in contact with the second gate via.

12. The device of claim 11, wherein a metal liner layer laterally surrounding the metal fill layer is in contact with the second gate via.

13. The device of claim 10, wherein the third conductive material is substantially the same as the first conductive material.

14. A method, comprising:
    forming, on a substrate, at least two nanostructure semiconductor channels spaced from each other;
    forming a gate structure over and surrounding the at least two nanostructure semiconductor channels;
    forming a source/drain region over and in the substrate;
    forming a source/drain contact in contact with the source/drain region;
    forming a first gate via by;
    forming a first opening exposing the gate structure;
    forming a metal liner layer of a first material in the first opening; and
    forming a first metal fill layer over the metal liner layer of a second material, the second material having a higher flowability than the first material; and
    forming a source/drain via by:
    forming a second opening exposing the source/drain contact; and
    forming a second metal fill layer in the second opening of a third material.

15. The method of claim 14, further comprising forming a glue layer in the first opening prior to forming the metal liner layer.

16. The method of claim 15, wherein forming the metal liner layer includes forming a conformal layer of a material having higher conductivity than the glue layer and the metal fill layer.

17. The method of claim 14, wherein the third material has higher conductivity and lower flowability than the second material.

18. The method of claim 14, wherein forming the second metal fill layer includes filling substantially the same material as the source/drain contact.

19. The method of claim 14, further comprising:
    forming an etch stop layer over the first gate via and the source/drain via;
    forming an interlayer dielectric over the etch stop layer;
    forming third openings exposing the first gate via and the source/drain via; and
    forming a second gate via and a second source/drain via by filling the third openings.

20. The method of claim 19, wherein filling the third openings includes filling the third openings with substantially the same material as the source/drain contact.

* * * * *